(12) United States Patent
Kawashima et al.

(10) Patent No.: US 9,478,584 B2
(45) Date of Patent: Oct. 25, 2016

(54) NONVOLATILE MEMORY DEVICE AND METHOD FOR MANUFACTURING THE SAME

(71) Applicant: Panasonic Intellectual Property Management Co., Ltd., Osaka (JP)

(72) Inventors: Yoshio Kawashima, Osaka (JP); Yukio Hayakawa, Kyoto (JP); Atsushi Himeno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/559,914

(22) Filed: Dec. 3, 2014

(65) Prior Publication Data

US 2015/0171142 A1 Jun. 18, 2015

(30) Foreign Application Priority Data

Dec. 16, 2013 (JP) ................................. 2013-259522

(51) Int. Cl.
  *H01L 45/00* (2006.01)
  *H01L 27/24* (2006.01)

(52) U.S. Cl.
  CPC ........... *H01L 27/2463* (2013.01); *H01L 45/08* (2013.01); *H01L 45/1233* (2013.01); *H01L 45/1246* (2013.01); *H01L 45/146* (2013.01); *H01L 45/1625* (2013.01); *H01L 45/1641* (2013.01); *H01L 45/1675* (2013.01)

(58) Field of Classification Search
  CPC ........................ H01L 45/1233; H01L 27/2463
  See application file for complete search history.

(56) References Cited

U.S. PATENT DOCUMENTS

| | | | |
|---|---|---|---|
| 7,678,642 B2* | 3/2010 | Chang | H01L 27/2436 257/E29.116 |
| 2009/0190392 A1 | 7/2009 | Sasaki | |
| 2009/0283736 A1 | 11/2009 | Kanzawa et al. | |
| 2012/0238055 A1 | 9/2012 | Mikawa et al. | |
| 2013/0112935 A1 | 5/2013 | Himeno et al. | |
| 2015/0171142 A1* | 6/2015 | Kawashima | H01L 27/2463 257/4 |

FOREIGN PATENT DOCUMENTS

| | | |
|---|---|---|
| JP | 2008-016557 | 1/2008 |
| JP | 2009-200458 | 9/2009 |
| WO | 2008/149484 | 12/2008 |
| WO | 2012/063495 | 5/2012 |
| WO | 2012/073503 | 6/2012 |
| WO | 2012/153818 | 11/2012 |
| WO | 2013/057920 | 4/2013 |

* cited by examiner

*Primary Examiner* — Mark Prenty
(74) *Attorney, Agent, or Firm* — McDermott Will & Emery LLP

(57) ABSTRACT

A nonvolatile memory device includes an insulating layer, oxygen diffusion prevention layers disposed on the insulating layer, a plurality of contact plugs, each of the plurality of the contact plugs penetrating through each of the plurality of the oxygen diffusion prevention layers and at least a part of the insulating layer, and a plurality of resistance-variable elements, each of the plurality of the resistance-variable elements covering each of the plurality of the contact plugs exposed on surfaces of the oxygen diffusion prevention layers and being electrically connected to each of the plurality of the contact plugs Each of the oxygen diffusion prevention layers is provided only between the insulating layer and each of the plurality of the resistance-variable elements to correspond to each of the plurality of the contact plugs arranged for each of the plurality of the resistance-variable elements.

7 Claims, 15 Drawing Sheets

NONVOLATILE MEMORY DEVICE AND METHOD FOR MANUFACTURING THE SAME

CROSS REFERENCES TO RELATED APPLICATIONS

This application claims priority to Japanese Patent Application No. 2013-259522, filed on Dec. 16, 2013, the contents of which are hereby incorporated by reference.

BACKGROUND

1. Technical Field

The present disclosure relates to a nonvolatile memory device and a method for manufacturing the same. More specifically, the present disclosure relates to a nonvolatile memory device that memories data using a material whose resistance value changes reversibly as a result of application of an electrical signal and a method for manufacturing the nonvolatile memory device.

2. Description of the Related Art

Recently, with the progress of digital technologies, higher functionality of electronic devices such as portable information devices and intelligent household electrical appliances has been increasingly realized. With the realization of high performance of these electronic devices, miniaturization and high-speed operation of semiconductor elements used in the electronic devices have rapidly proceeded. In particular, applications of nonvolatile memory having a large storage capacity, such as flash memory, have been rapidly increasing. Furthermore, with regard to a next-generation novel nonvolatile memory to replace flash memory, research and development of a resistance-variable nonvolatile semiconductor memory element using a so-called resistance-variable element has progressed. Herein, the term "resistance-variable element" refers to an element having a property in which the resistance value can be reversibly changed by an electrical signal. The resistance-variable element is capable of storing data corresponding to this resistance value in a nonvolatile manner.

International Publication No. 2012/063495 (Patent Literature 1) discloses a method for manufacturing a nonvolatile semiconductor memory element that includes a resistance-variable element formed on a contact plug, the nonvolatile semiconductor memory element including a lower electrode, a resistance-variable layer, and an upper electrode. The method includes, before a step of forming the lower electrode by pattering a first conductive film, a step of oxidizing an edge of the resistance-variable layer so as to provide an insulating property.

International Publication No. 2013/057920 (Patent Literature 2) discloses a nonvolatile memory element including a first wiring, a first plug that is disposed on the first wiring and electrically connected to the first wiring, a degeneration prevention layer that covers the entire region of an upper surface of the first plug and has electrical conductivity, a resistance-variable element that covers a part of an upper surface of the degeneration prevention layer and that is electrically connected to the first plug with the degeneration prevention layer therebetween, and a second wiring that is disposed on the resistance-variable element and electrically connected to the resistance-variable element. In the nonvolatile memory element, the resistance-variable element includes a resistance-variable layer whose resistance state changes reversibly on the basis of an electrical signal applied, and a horizontal cross section of a lower surface of the degeneration prevention layer is equal to a horizontal cross section of the upper surface of the first plug.

SUMMARY

In the nonvolatile memory devices in the related art, although oxidation of a contact plug can be suppressed to a certain degree, there may be a problem in that further miniaturization of a nonvolatile memory element is difficult.

The present disclosure provides a nonvolatile memory device in which further miniaturization of a nonvolatile memory element can be realized while suppressing oxidation of a contact plug.

A nonvolatile memory device according to an aspect of the present disclosure includes an insulating layer, a plurality of oxygen diffusion prevention layer disposed on the insulating layer, a plurality of contact plugs, each of the plurality of the contact plugs penetrating through each of the plurality of the oxygen diffusion prevention layers and at least a part of the insulating layer, and a plurality of resistance-variable elements, each of the plurality of the resistance-variable elements covering each of the plurality of the contact plugs exposed on surfaces of the oxygen diffusion prevention layers and being electrically connected to each of the plurality of the contact plugs. Each of the oxygen diffusion prevention layers is divided only between the insulating layer and the each of the plurality of resistance-variable elements to correspond to each of the plurality of the contact plugs arranged for each of the plurality of the resistance-variable elements.

According to the aspect of the present disclosure, it is advantageous in that, in a nonvolatile memory device, further miniaturization of a nonvolatile memory element is realized while suppressing oxidation of a contact plug.

Additional benefits and advantages of the disclosed embodiments will be apparent from the specification and Figures. The benefits and/or advantages may be individually provided by the various embodiments and features of the specification and Figures, and need not all be provided in order to obtain one or more of the same.

DETAILED DESCRIPTION (Terms)

Figure 1:
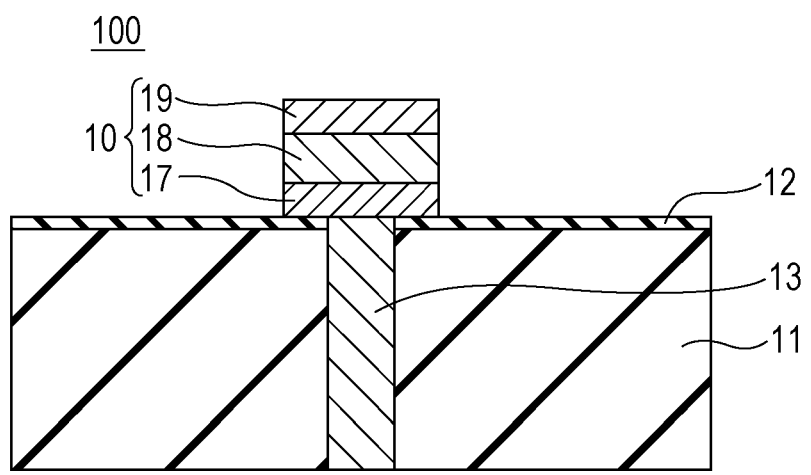
FIG. 1 is a cross-sectional view showing an example of a schematic structure of a nonvolatile memory device according to a first reference embodiment.

In embodiments of the present disclosure, an "oxygen content" is represented by a ratio of the number of oxygen atoms contained in a metal oxide to the total number to atoms that constitute the metal oxide.

The term "degree of oxygen deficiency" refers to a ratio of oxygen that is deficient in a metal oxide relative to the amount of oxygen constituting an metal oxide having a stoichiometric composition (in the case where a plurality of stoichiometric compositions are present, among the stoichiometric compositions, a stoichiometric composition having the highest resistance value). Such a metal oxide having a stoichiometric composition is stable and has a high resistance value compared with metal oxides having other compositions.

For example, in the case where the metal is tantalum (Ta), the composition of a stoichiometric metal oxide in accordance with the above definition is $Ta_2O_5$ and thus can be represented by $TaO_{2.5}$. The degree of oxygen deficiency of $TaO_{2.5}$ is 0%. For example, the degree of oxygen deficiency of an oxygen-deficient tantalum oxide having a composition of $TaO_{1.5}$ is determined as "degree of oxygen deficiency= $(2.5-1.5)/2.5=40\%$". In the case of an oxygen-excessive metal oxide, the degree of oxygen deficiency is a negative value. In this specification, unless otherwise stated, a description will be made on the assumption that the degree of oxygen deficiency includes a positive value, zero, and a negative value.

An oxide having a small degree of oxygen deficiency is closer to an oxide having a stoichiometric composition and thus has a high resistance value. An oxide having a large degree of oxygen deficiency is closer to a metal contained in the oxide and thus has a low resistance value.

The term "oxygen-deficient metal oxide" means a metal oxide having an oxygen content (atom ratio: the ratio of the number of oxygen atoms relative to the total number of atoms) lower than that of a metal oxide having a stoichiometric composition.

The term "metal oxide having a stoichiometric composition" refers to a metal oxide having a degree of oxygen deficiency of 0%. For example, in the case of a tantalum oxide, the term "metal oxide having a stoichiometric composition" refers to $Ta_2O_5$. $Ta_2O_5$ is an insulator. Note that in the case where a metal oxide is an oxygen-deficient metal oxide, the metal oxide has electrical conductivity. An oxide having a small degree of oxygen deficiency is closer to an oxide having a stoichiometric composition and thus has a high resistance value. An oxide having a large degree of oxygen deficiency is closer to a metal contained in the oxide and thus has a low resistance value.

The "oxygen content" is represented by a ratio of the number of oxygen atoms contained in a metal oxide to the total number of atoms that constitute the metal oxide. The oxygen content of $Ta_2O_5$ is represented by the ratio of the number of oxygen atoms to the total number of atoms (O/(Ta+O)) and is 71.4 atomic percent. Accordingly, an oxygen-deficient tantalum oxide has an oxygen content of more than 0 and 71.4 atomic percent or less. In the case where a metal contained in a first metal oxide is the same as a metal contained in a second metal oxide, the oxygen content correlates with the degree of oxygen deficiency. Specifically, when the oxygen content of the second metal oxide is larger than the oxygen content of the first metal oxide, the degree of oxygen deficiency of the second metal oxide is smaller than the degree of oxygen deficiency of the first metal oxide. In addition, the magnitude relationship of the degree of oxide deficiency can be expressed by using the oxygen content. For example, in the case where the degree of oxygen deficiency of the first metal oxide is larger than the degree of oxygen deficiency of the second metal oxide, the oxygen content of the first metal oxide is smaller than the oxygen content of the second metal oxide.

The term "insulator" follows a general definition. Specifically, the term "insulator" refers to a material having a resistivity of $10^8$ Ω·cm or higher (Non-Patent Literature: "Semiconductor engineering for integrated circuit" Kogyo Chosakai Publishing Co., Ltd. (1992), Akira Usami, Shinji Kanefusa, Takao Maekawa, Hajime Tomokage, and Morio Inoue). In contrast, the term "conductor" refers to a material having a resistivity of lower than $10^8$ Ω·cm. Note that, before an initial breakdown operation is carried out, the resistivity of the first metal oxide and the resistivity of the second metal oxide differ by at least 4 to 6 orders of magnitude. After the initial breakdown operation is carried out, the resistivity of a resistance-variable element is, for example, about $10^4$ Ω·cm.

A "standard electrode potential" is generally an indicator of the ease of oxidation. When a substance has a large standard electrode potential, the substance is not easily oxidized. When a substance has a small standard electrode potential, the substance is easily oxidized. With an increase in the difference between the standard electrode potential of an electrode and the standard electrode potential of a low-oxygen-deficiency layer (second resistance-variable layer) having a small degree of oxygen deficiency, an oxidation-reduction reaction occurs more easily, and a change in the resistance occurs more easily. With a decrease in the difference in the standard electrode potential, neither an oxidation-reduction reaction nor a change in the resistance occurs easily. Accordingly, it is presumed that the ease of oxidation plays a significant role in the mechanism of a resistance change phenomenon.

(Preliminary Studies)

The inventors of the present disclosure conducted intensive studies in order to realize further miniaturization of a nonvolatile memory element and to suppress oxidation of a contact plug in a nonvolatile memory device. As a result, the following was found. Note that the finding described below serves as an assistant to understand embodiments described below. Accordingly, the present disclosure is not limited to the description.

In the structure described in Patent Literature 1, for example, since the oxidation of the resistance-variable layer is performed before the patterning of the lower electrode, the surface of the lower electrode is oxidized. After that, when the lower electrode is etched, the etching of the lower electrode does not easily be performed etching because the surface of the lower electrode contains oxygen due to the above oxidation. As a result of patterning, the lower electrode has a tapered shape. The area of the lower electrode (the area of the lower end surface) becomes larger than that of a resistance-variable element produced by patterning layers of a lower electrode, a resistance-variable layer, and an upper electrode that constitute the resistance-variable element at one time, and then by oxidizing the resistance-variable layer. Thus, it becomes difficult to realize miniaturization of the element. It is believed that this problem occurs because the lower electrode is used for preventing diffusion of oxygen.

The structure including a lower electrode having a tapered shape may cause the following problem. In the future, with the realization of miniaturization of resistance-variable elements and an increase in the storage capacity of a memory device, the resistance-variable elements are arranged at a higher density (the dimensions of the resistance-variable elements are reduced and a gap between the resistance-variable elements is reduced), the resistance-variable elements are not separated from each other and a short-circuit may occur (the lower electrodes are short-circuited between adjacent elements), which may result in the operation failure.

In the structure described in Patent Literature 2, the degeneration prevention layer is formed between the lower electrode and the contact plug, and thus the material of the degeneration prevention layer is limited to a conductor. Accordingly, the range of selectivity for the material is decrease. In addition, since the area of the degeneration prevention layer is equal to the area of the contact plug, oxygen may pass through an interlayer insulating layer and reach the plug. Thus, there is a room for improving the effect of suppressing the oxidation of the contact plug. Oxidation of the contact plug may cause variations in the resistance value of the element, operation failure of the elements, etc. Thus, it is desirable to suppress the oxidation of the contact plug.

The inventors of the present disclosure conceived the structure including an insulating layer, an oxygen diffusion prevention layer disposed so as to cover the insulating layer, a contact plug disposed so as to penetrate through the oxygen diffusion prevention layer and at least a part of the insulating layer, and a resistance-variable element that covers the entire surface of the contact plug exposed on a surface of the oxygen diffusion prevention layer and that is electrically connected to the contact plug.

In this structure, the oxygen diffusion prevention layer is provided independently from the lower electrode included in the resistance-variable element. Accordingly, for example, oxidation of the resistance-variable layer can be performed after the etching of the lower electrode. Thus, a tapered shape of the lower electrode is not necessarily formed.

In addition, since the contact plug penetrates through the oxygen diffusion prevention layer, the oxygen diffusion prevention layer is formed so as to surround the periphery of a top end of the contact plug. Consequently, the possibility in which oxygen passes through the insulating layer and reaches the contact plug is deceased, and the effect of suppressing oxidation of the contact plug is improved.

Furthermore, since the oxygen diffusion prevention layer need not be interposed between the contact plug and the resistance-variable element, the oxygen diffusion prevention layer may be composed of a conductive material or a non-conductive material. Thus, the range of selectivity for the material is improved.

A step of oxidation performed by a heat treatment in an oxygen-containing atmosphere or a plasma treatment in an oxygen-containing atmosphere is not limited to oxidation of the resistance-variable layer and may be any treatment.

A nonvolatile memory device according to an embodiment of the present disclosure will be described with reference to the attached drawings.

A nonvolatile memory device according to an aspect of the present disclosure includes an insulating layer, a plurality of oxygen diffusion prevention layers disposed on the insulating layer, a plurality of contact plugs, each of the plurality of the contact plugs penetrating through each of the plurality of the oxygen diffusion prevention layers and at least a part of the insulating layer, and a plurality of resistance-variable elements, each of the plurality of the resistance-variable elements covering each of the plurality of the contact plugs exposed on surfaces of the oxygen diffusion prevention layers and being electrically connected to each of the plurality of the contact plugs. Each of the oxygen diffusion prevention layers is provided only between the insulating layer and each of the plurality of the resistance-variable elements to correspond to each of the plurality of the contact plugs arranged for each of the plurality of the resistance-variable elements.

In the above aspect, each of the plurality of the resistance-variable elements includes a first electrode, a second electrode disposed above the first electrode, and a resistance-variable layer which is disposed between the first electrode and the second electrode. A resistance value of the resistance-variable layer changes reversibly on the basis of an electrical signal applied between the first electrode and the second electrode.

In the above aspect, each of the plurality of the resistance-variable elements may further include a sidewall protection layer that covers a sidewall of each of the plurality of the resistance-variable elements and that is composed of an insulating material. In a thickness direction of the insulating layer, an outer periphery of the sidewall protection layer may be flush with an outer periphery of the corresponding oxygen diffusion prevention layer.

In the above aspect, each of the plurality of the oxygen diffusion prevention layers may be composed of at least one selected from the group consisting of nitrides, oxygen-deficient silicon oxides, oxygen-deficient aluminum oxides, and oxygen-deficient titanium oxides.

In the above aspect, a peripheral edge of each of the resistance-variable layers may be oxidized by a heat treatment in an oxygen-containing atmosphere or by a plasma treatment in an oxygen-containing atmosphere.

In the above aspect, the sidewall protection layer and the oxygen diffusion prevention layers may be composed of the same material.

A method for manufacturing a nonvolatile memory device according to an aspect of the present disclosure is a method for manufacturing a nonvolatile memory device including a plurality of resistance-variable elements and a plurality of contact plugs, each of the plurality of the resistance-variable elements including i) a first electrode, ii) a second electrode disposed above the first electrode, and iii) a resistance-variable layer which is disposed between the first electrode and the second electrode, resistance value of the resistance-variable layer changing reversibly on the basis of an electrical signal provided between the first electrode and the second electrode. The method includes (a) forming an insulating layer, (b) forming an oxygen diffusion prevention layers to cover the insulating layer, (c) forming a plurality of contact plugs penetrate through the oxygen diffusion prevention layers and at least a part of the insulating layer, (d) forming a first electrode layer to cover entire surfaces of the plurality of the contact plugs exposed on surfaces of the oxygen diffusion prevention layers, (e) forming a resistance-variable material layer on the first electrode layer, (f) forming a second electrode layer on the resistance-variable material layer, (g) forming a first mask on the second electrode layer, (h) forming a plurality of resistance-variable elements by patterning the first electrode layer, the resistance-variable material layer, and the second electrode layer, using the first mask, and (i) dividing each of the oxygen diffusion prevention layers into portions by patterning the oxygen diffusion prevention layer to provide each of the portions between the insulating layer and each of the plurality of the resistance-variable elements, each of the portions corresponding to the each of the plurality of the contact plugs arranged for each of the plurality of the resistance-variable elements, each of the plurality of the contact plugs being electrically connected to each of the plurality of the resistance-variable elements.

In the above aspect, the method may further include, after the patterning of the first electrode layer, the resistance-variable material layer, and the second electrode layer, and before the patterning of the oxygen diffusion prevention layers, a step (j) oxidizing a peripheral edge of the resistance-variable layer by a heat treatment in an oxygen-containing atmosphere or by a plasma treatment in an oxygen-containing atmosphere.

In the above aspect, the method may further include, after the oxidizing (j), a step (k) forming a sidewall protection layer composed of an insulating material. The sidewall protection layer covers a sidewall of each of the plurality of the resistance-variable elements.

In the above aspect, the method may further include, after forming the plurality of the resistance-variable elements, a step (l) removing the first mask and forming a sidewall protection layer composed of an insulating material around a sidewall of each of the plurality of the resistance-variable elements. Dividing each of the oxygen diffusion prevention layers into the portions includes removing a part of each of the oxygen diffusion prevention layers by using the sidewall protection layer as a second mask, the removed part being other than a part covered with the sidewall protection layer.

In the above aspect, the method may further include, after forming of the resistance-variable elements by patterning the first electrode layer, the resistance-variable material layer, and the second electrode layer and before forming of the sidewall protection layer, oxidizing a peripheral edge of the resistance-variable layer by a heat treatment in an oxygen-containing atmosphere or by a plasma treatment in an oxygen-containing atmosphere.

In the description of the present disclosure, regarding a layer disposed between a first electrode and a second electrode, the term "top surface" refers to a surface that faces the second electrode side among surfaces of the layer. On the other hand, regarding a layer disposed between the first electrode and the second electrode, the term "bottom surface" refers to a surface that faces the first electrode side among surfaces of the layer. Note that these surfaces are not limited to flat surfaces and may be curved surfaces.

Embodiments described below are each a specific example of the present disclosure. The numerical values, the shapes, the materials, the components, the arrangement positions and connection types of the components, the steps, the order of steps, etc. are only illustrative and do not limit the present disclosure. Among components in the embodiments described below, components that are not described in independent claims representing the broadest concept of the present disclosure are described as optional components. In the drawings, components assigned with the same reference numerals are assumed to be components that have substantially the same structure, the same operation, the same advantages, etc. and a description of such components may be omitted. In the drawings, components are schematically drawn for the sake of easy understanding. Regarding the shapes, the dimensions and scales, the number of components, and the like, the present disclosure is not limited by the structures shown in the drawings. In manufacturing methods, the order of steps, etc. may be changed, and other known steps may be added to the methods.

Prior to a description of a nonvolatile memory device and a method for manufacturing the nonvolatile memory device according to embodiments of the present disclosure, reference embodiments which have basic structures of the embodiments will be described.

(First Reference Embodiment)

A nonvolatile memory device according to a first reference embodiment includes an insulating layer, an oxygen diffusion prevention layer disposed to cover the insulating layer, a contact plug disposed to penetrate through the oxygen diffusion prevention layer and at least a part of the insulating layer, and a resistance-variable element that covers the entire surface of the contact plug exposed on a surface of the oxygen diffusion prevention layer and that is electrically connected to the contact plug. The resistance-variable element includes a first electrode, a second electrode disposed above the first electrode, and a resistance-variable layer which is disposed between the first electrode and the second electrode and whose resistance value changes reversibly on the basis of an electrical signal applied between the first electrode and the second electrode.

With this structure, since the nonvolatile memory device includes the oxygen diffusion prevention layer disposed cover the insulating layer, further miniaturization of the nonvolatile memory element is realized, and an oxidation of the contact plug is suppressed.

In the nonvolatile memory device, the oxygen diffusion prevention layer may be composed of at least one selected from the group consisting of nitrides, oxygen-deficient silicon oxides, oxygen-deficient aluminum oxides, and oxygen-deficient titanium oxides.

With this structure, the possibility in which oxygen reaches the contact plug in the oxidation process is decreased, and oxidation of the contact plug is suppressed.

In the nonvolatile memory device, a peripheral edge (sidewall portion) of the resistance-variable layer may be oxidized by a heat treatment in an oxygen-containing atmosphere or by a plasma treatment in an oxygen-containing atmosphere.

With this structure, an active area (i.e., effective area that affects electrical properties of the element) is decreased, a leakage current is decreased, a breakdown voltage is made constant, and an application time is reduced.

In the nonvolatile memory device, a sidewall protection layer and the oxygen diffusion prevention layer may be composed of the same material.

A method for manufacturing the nonvolatile memory device according to the first reference embodiment includes the steps of forming an insulating layer, forming an oxygen diffusion prevention layer to cover the insulating layer, forming a contact plug to penetrate through the oxygen diffusion prevention layer and at least a part of the insulating layer, and forming a resistance-variable element to cover the entire surface of the contact plug exposed on a surface of the oxygen diffusion prevention layer and to be electrically connected to the contact plug, in which the nonvolatile memory element includes a first electrode, a second electrode formed above the first electrode, and a resistance-variable layer which is applied between the first electrode and the second electrode and whose resistance value changes reversibly on the basis of an electrical signal applied between the first electrode and the second electrode.

With this structure, in the nonvolatile memory device, the nonvolatile memory element is further miniaturized, and an oxidation of the contact plug is suppressed.

[Structure of Device]

FIG. 1 is a cross-sectional view showing an example of a schematic structure of a nonvolatile memory device according to a first reference embodiment. A nonvolatile memory device 100 according to the first reference embodiment will be described with reference to FIG. 1.

In the example shown in FIG. 1, the nonvolatile memory device 100 includes an insulating layer 11, an oxygen diffusion prevention layer 12, a contact plug 13, and a resistance-variable element 10.

<Insulating Layer>

The insulating layer 11 is a layer composed of an insulating material. Examples of the insulating material include silicon oxide ($SiO_2$) and a low-k film (for example, SiOC obtained by adding carbon (C) to $SiO_2$). The insulating layer 11 may be formed of, for example, a silicon oxide layer having a thickness of 100 nm or more and 500 nm or less and formed on a silicon substrate.

<Oxygen Diffusion Prevention Layer>

The oxygen diffusion prevention layer 12 is a layer formed to cover the insulating layer 11. The oxygen diffusion prevention layer 12 is composed of an oxygen diffusion prevention material. The mechanism of prevention of oxygen diffusion by the oxygen diffusion prevention layer 12 is not particularly limited. For example, as in the case of a nitride, the diffusion of oxygen may be prevented by preventing oxygen from entering. Alternatively, as in the case of an oxygen-deficient oxide, the diffusion of oxygen may be prevented by absorbing oxygen.

The phrase "prevention of oxygen diffusion" refers to decreasing the possibility in which when at least a part of a resistance-variable element is formed to cover an entire surface of a contact plug and the resistance-variable element in the course of the formation is exposed to oxygen during a high-temperature treatment in an oxygen atmosphere, an oxygen plasma treatment, or the like, the oxygen diffuses in an insulating layer and reaches the contact plug.

Examples of the oxygen diffusion prevention material include nitrides and oxygen-deficient oxides. More specifically, for example, at least one selected from the group consisting of nitrides, oxygen-deficient silicon oxides, oxygen-deficient aluminum oxides, and oxygen-deficient titanium oxides may be used as the oxygen diffusion prevention material. For example, silicon nitride or the like may be used as the nitride.

The oxygen diffusion prevention layer 12 may have a thickness of, for example, 30 nm or more and 200 nm or less.

<Contact Plug>

The contact plug 13 is provided to penetrate through the insulating layer 11 and the oxygen diffusion prevention layer 12. The contact plug 13 is provided in order to connect the resistance-variable element 10 to a wiring or the like that is provided below the resistance-variable element 10. The contact plug 13 does not necessarily completely penetrate through an upper surface of the insulating layer 11 and a lower surface of the insulating layer 11. The contact plug 13 is connected to a wiring (not shown) arranged below the contact plug 13. However, for example, in the case where the wiring is arranged in the insulating layer 11, a through-hole (contact hole) may be partially formed in the insulating layer 11 so as to extend to the upper surface of the wiring, and the contact plug 13 may be formed in the through-hole.

The contact plug 13 may have, for example, a cylindrical shape having a diameter of 50 nm or more and 200 nm or less.

The contact plug 13 may include a portion composed of an elemental metal. Alternatively, the contact plug 13 may include a main portion composed of an elemental metal and an adhesion layer (composed of titanium nitride or the like). The main portion of the contact plug 13 may be composed of, for example, tungsten, copper, or the like. In the case where the contact plug 13 includes a portion composed of an elemental metal or the main portion of the contact plug 13 is composed of an elemental metal, the contact plug is easily oxidized. However, in this first reference embodiment, diffusion of oxygen is suppressed by the oxygen diffusion prevention layer 12. Thus, oxidation of the contact plug 13 can be suppressed.

<Resistance-Variable Element>

The resistance-variable element 10 covers the entire surface of the contact plug 13 exposed on a surface of the oxygen diffusion prevention layer 12 and is electrically connected to the contact plug 13. The resistance-variable element 10 includes a lower electrode 17, a resistance-variable layer 18, and an upper electrode 19.

The resistance-variable element 10 may cover the entire surface of the contact plug 13 exposed on a surface of the oxygen diffusion prevention layer 12 and may be electrically connected to the contact plug 13.

With this structure, oxidation of the contact plug can be more effectively suppressed.

<Lower Electrode>

The lower electrode 17 (first electrode) may be formed of, for example, a tantalum nitride film having a thickness of 50 to 200 nm. In this case, tantalum nitride is a first electrode material.

In the case where tantalum is used as a transition metal contained in the resistance-variable layer 18, the lower electrode 17 may be composed of a material which has a standard electrode potential equal to or lower than that of tantalum and whose resistance does not easily change. Specifically, at least one material selected from the group consisting of tantalum, tantalum nitride, titanium, titanium nitride, and titanium aluminum nitride may be used as the lower electrode 17. Stable memory properties can be realized with this structure.

The lower electrode 17 may be physically connected to the contact plug 13. Alternatively, the lower electrode 17 may be connected to the contact plug 13 with a conductor therebetween. In the example shown in FIG. 1, the lower electrode 17 is physically connected to the contact plug 13. As shown in the example in FIG. 1, the lower electrode 17 may cover the entire surface of the contact plug 13 when viewed from a direction of the top surface.

The lower electrode 17 may be composed of a material that is not easily oxidized as compared with the contact plug 13.

<Resistance-Variable Layer>

The resistance-variable layer 18 is applied between the lower electrode 17 and the upper electrode 19. The resistance value of the resistance-variable layer 18 changes reversibly on the basis of an electrical signal applied between the lower electrode 17 and the upper electrode 19.

The resistance-variable layer 18 is formed on the lower electrode 17. The resistance-variable layer 18 changes reversibly between a high-resistance state and a low-resistance state in which the resistance value is lower than that in the high-resistance state on the basis of an electrical signal applied between the lower electrode 17 and the upper electrode 19.

In the example shown in FIG. 1, the resistance-variable layer 18 is sandwiched between the lower electrode 17 and the upper electrode 19, and is formed of an oxygen-deficient tantalum oxide layer having a thickness of 20 to 100 nm.

The resistance-variable layer may include at least two layers including a first resistance-variable layer composed of a first metal oxide and a second resistance-variable layer composed of a second metal oxide having an oxygen content higher than that of the first metal oxide.

That is, the resistance-variable layer 18 may have a stacked-layer structure including a first resistance-variable layer and a second resistance-variable layer. The first resistance-variable layer may be composed of an oxygen-deficient tantalum oxide ($TaO_x$, $0<x<2.5$). The second resistance-variable layer may be composed of tantalum oxide ($TaO_y$, $x<y$) having a degree of oxygen deficiency smaller than that of the first resistance-variable layer.

In the above example, a description has been made of a case where both a first metal contained in the first metal oxide and a second metal contained in the second metal oxide are tantalum (Ta). However, the first metal oxide and the second metal oxide are not limited thereto.

Each of the first metal oxide and the second metal oxide that constitute the resistance-variable layer 18 may contain at least one selected from the group consisting of transition metal oxides and aluminum oxides. Each of the first metal oxide and the second metal oxide that constitute the resistance-variable layer 18 may contain at least one selected from the group consisting of tantalum oxides, hafnium oxides, and zirconium oxides.

Besides tantalum (Ta), at least one transition metal selected from the group consisting of, for example, titanium (Ti), hafnium (Hf), zirconium (Zr), niobium (Nb), and tungsten (W) may be used as the first metal and the second metal. Since transition metals can be in a plurality of oxidation states, different resistance states can be realized by an oxidation-reduction reaction. Aluminum (Al) may be used as the first metal and the second metal.

In the case where hafnium oxides are used, when the composition of the first metal oxide contained in the first resistance-variable layer is represented by $HfO_x$ and the composition of the second metal oxide contained in the second resistance-variable layer is represented by $HfO_y$, the relationship $x<y$ may be satisfied. Furthermore, x and y may satisfy $0.9 \leq x \leq 1.6$ and $1.8 < y < 2.0$.

In this case, a layer having a high degree of oxygen deficiency (hereinafter referred to as "high oxygen-deficient layer") (first resistance-variable layer) composed of a hafnium oxide can be formed by, for example, reactive sputtering in which sputtering is performed in argon gas and oxygen gas using a Hf target. As in the case of tantalum oxides, the oxygen content of the high oxygen-deficient layer can be easily adjusted by changing the flow ratio of oxygen gas to argon gas during the reaction sputtering. A substrate is not necessarily heated. The substrate temperature may be room temperature.

A layer having a low degree of oxygen deficiency (hereinafter referred to as "low oxygen-deficient layer") (second resistance-variable layer) composed of a hafnium oxide can be formed by, for example, exposing a surface of the high oxygen-deficient layer to a plasma of a mixed gas of argon gas and oxygen gas. The thickness of the low oxygen-deficient layer can be easily adjusted by changing the duration of exposure to the plasma of the mixed gas of argon gas and oxygen gas. The thickness of the second resistance-variable layer may be 3 to 4 nm.

In the case where zirconium oxides are used, when the composition of the first metal oxide contained in the first resistance-variable layer is represented by $ZrO_x$ and the composition of the second metal oxide contained in the second resistance-variable layer is represented by $ZrO_y$, the relationship $x<y$ may be satisfied. Furthermore, x and y may satisfy $0.9 \leq x \leq 1.4$ and $1.9 < y < 2.0$.

In this case, a high oxygen-deficient layer (first resistance-variable layer) composed of a zirconium oxide can be formed by, for example, reactive sputtering in which sputtering is performed in argon gas and oxygen gas using a Zr target. As in the case of tantalum oxides, the oxygen content of the high oxygen-deficient layer can be easily adjusted by changing the flow ratio of oxygen gas to argon gas during the reaction sputtering. A substrate may not be particularly heated, and the substrate temperature may be room temperature.

A low oxygen-deficient layer (second resistance-variable layer) composed of a zirconium oxide can be formed by, for example, exposing a surface layer portion of the high oxygen-deficient layer to a plasma of a mixed gas of argon gas and oxygen gas. The thickness of the low oxygen-deficient layer can be easily adjusted by changing the duration of exposure to the plasma of the mixed gas of argon gas and oxygen gas. The thickness of the second resistance-variable layer may be 1 to 5 nm.

The hafnium oxide layers and the zirconium oxide layers described above may be formed by chemical vapor deposition (CVD) or atomic layer deposition (ALD) instead of sputtering.

As the second metal oxide, a material having a degree of oxygen deficiency smaller (a resistance value higher) than that of the first metal oxide may be selected. With this structure, a voltage applied between the lower electrode 17 and the upper electrode 19 is distributed to the second resistance-variable layer in a larger amount. In addition, oxygen that can contribute to a reaction is abundantly present in the vicinity of the interface between the upper electrode 19 and the second resistance-variable layer. Thus, an oxidation-reduction reaction selectively occurs at the interface between the upper electrode 19 and the second resistance-variable layer, and a change in the resistance can be stably realized. As a result, the oxidation-reduction reaction generated in the second resistance-variable layer can be more easily induced.

The first metal contained in the first metal oxide and the second metal contained in the second metal oxide may be different metals.

The resistance change phenomenon in the resistance-variable layer containing an oxygen-deficient metal oxide is caused by migration of oxygen. Therefore, the types of metals contained in the oxides may be different from each other as long as the migration of oxygen can occur. Accordingly, it is presumed that even in the case where different metals are used as the first metal contained in the first resistance-variable layer and the second metal contained in the second resistance-variable layer, the same effect can be obtained.

In the case where different metals are used as the first metal and the second metal, the standard electrode potential of the second metal may be lower than the standard electrode potential of the first metal. This is because it is believed that the resistance change phenomenon occurs as follows. Specifically, an oxidation-reduction reaction occurs in fine filaments (conductive paths) formed in the second metal oxide contained in the second resistance-variable layer having a high resistance, and the resistance value of the second resistance-variable layer changes.

For example, a stable resistance change operation can be obtained by using an oxygen-deficient tantalum oxide as the first resistance-variable layer and using titanium oxide ($TiO_2$) as the second resistance-variable layer. Titanium (standard electrode potential=1.63 eV) is a material having a standard electrode potential lower than that of tantalum (standard electrode potential=−0.6 eV). The higher the standard electrode potential, the lower the degree of oxidation. By arranging, as the second resistance-variable layer, an oxide of a metal having a standard electrode potential lower than that of the first resistance-variable layer, the oxidation-reduction reaction is more easily induced in the second resistance-variable layer. With regard to an example of other combinations, an oxygen-deficient tantalum oxide ($TaO_x$) may be used as the first resistance-variable layer and aluminum oxide ($Al_2O_3$) may be used as the second resistance-variable layer.

Sidewall portions of the resistance-variable layer 18 may be oxidized.

The high oxygen-deficient layer and the low oxygen-deficient layer each include an oxide layer of tantalum, hafnium, zirconium, or the like or an oxide layer of aluminum as a main resistance-variable layer in which a change in the resistance occurs. In addition to the above, for example, a trace amount of other elements may be contained in the high oxygen-deficient layer and the low oxygen-deficient layer. For example, for the purpose of finely adjusting the resistance value, a small amount of other elements may be intentionally added. Such a case is also covered by the scope of the present disclosure. For example, by adding nitrogen to the resistance-variable layer, the resistance value of the resistance-variable layer is increased and reactivity of the change in the resistance can be improved.

When a resistance-variable layer is formed by sputtering, a trace amount of unintentional element may be mixed in the resistance-variable layer due to a residual gas or a gas released from a wall of a vacuum container. Such a case where a trace amount of elements are mixed in the resistance-variable layer is also covered by the scope of the present disclosure.

The resistance-variable layer 18 does not necessarily include two layers. Alternatively, the resistance-variable layer 18 may include three layers. The resistance-variable layer 18 may include a single layer.

<Upper Electrode>

The upper electrode 19 (second electrode) is an electrode formed above the lower electrode 17. The upper electrode 19 is formed on the resistance-variable layer 18. The upper electrode 19 may be composed of iridium (Ir). In this case, the lower electrode 17 functions as a first electrode and the upper electrode 19 functions as a second electrode.

The upper electrode 19 may be composed of, for example, at least one material selected from the group consisting of iridium, platinum (Pt), and palladium (Pd), that is, a material having a standard electrode potential higher than that of the metal contained in the second resistance-variable layer of the resistance-variable layer 18 and the first electrode material contained in the lower electrode 17. With this structure, an oxidation-reduction reaction selectively occurs in the vicinity of the interface between the upper electrode 19 and the second resistance-variable layer in the second resistance-variable layer, and a stable resistance change phenomenon is realized.

According to the structure described above, since the contact plug 13 penetrates through the oxygen diffusion prevention layer 12, the oxygen diffusion prevention layer 12 is formed so as to surround the periphery of the top end of the contact plug 13. Accordingly, the possibility in which oxygen passes through the insulating layer 11 and reaches the contact plug 13 is decreased, and the effect of suppressing oxidation of the contact plug 13 is improved.

In addition, since the oxygen diffusion prevention layer 12 is provided independently from the lower electrode 17, for example, oxidation of the resistance-variable layer 18 can be performed after the whole resistance-variable element including the lower electrode 17 is etched. In Patent Literature 1 described in the section of Background, since oxidation of the resistance-variable layer is performed prior to the processing of the lower electrode, the surface of the lower electrode is oxidized. When the lower electrode is subsequently etched, the etching of the lower electrode does not easily proceed because oxygen is contained in the surface of the lower electrode due to the above oxidation. As a result of patterning, the lower electrode has a tapered shape. In contrast, when the oxygen diffusion prevention layer 12 is provided independently from the lower electrode 17 and oxidation of the resistance-variable layer 18 is performed after the entire resistance-variable element including the lower electrode 17 is etched, a tapered shape of the lower electrode 17 is not easily formed.

Furthermore, since the oxygen diffusion prevention layer 12 need not be interposed between the contact plug 13 and the resistance-variable element 10, the oxygen diffusion prevention layer 12 may be composed of a conductive material or a non-conductive material. Thus, the range of selectivity for the material is expanded.

[Manufacturing Method]

Figure 2A:
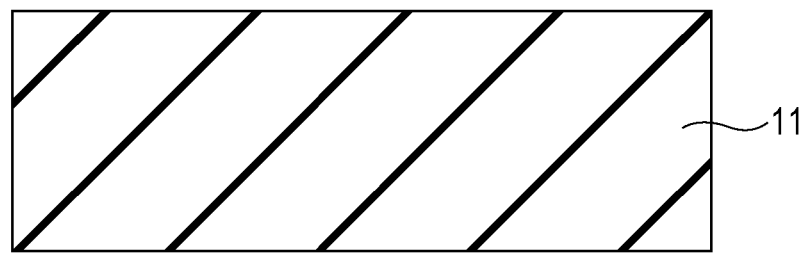
FIGS. 2A to 2F are cross-sectional views each showing a step of an example of a method for manufacturing the nonvolatile memory device according to the first reference embodiment.
Figure 2B:
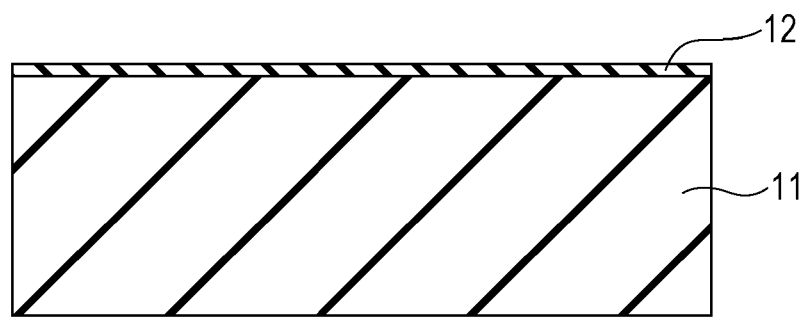
Figure 2C:
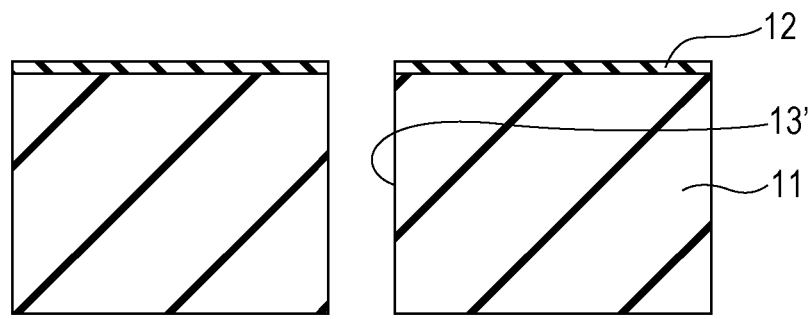
Figure 2D:
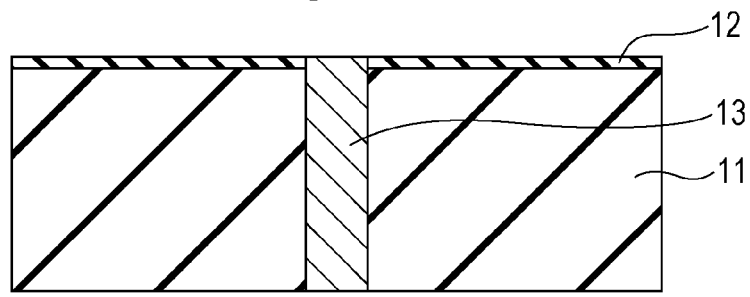
Figure 2E:
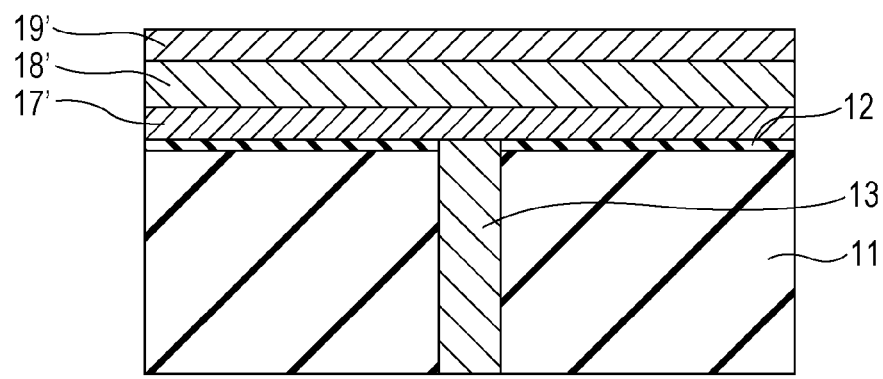
Figure 2F:
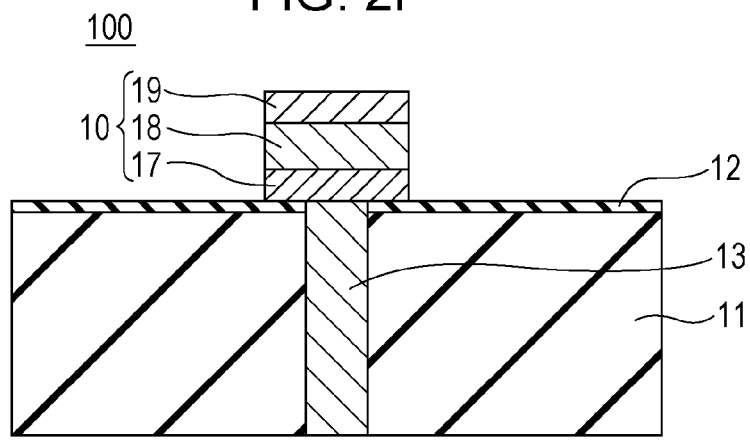

FIGS. 2A to 2F are cross-sectional views each showing a step of an example of a method for manufacturing the nonvolatile memory device according to the first reference embodiment. FIG. 2A is a cross-sectional view showing a step of forming an insulating layer. FIG. 2B is a cross-sectional view showing a step of forming an oxygen diffusion prevention layer so as to cover the insulating layer. FIG. 2C is a cross-sectional view showing a step of forming a contact hole so as to penetrate through the oxygen diffusion prevention layer and the insulating layer. FIG. 2D is a cross-sectional view showing a step of filling the contact hole with a contact plug. FIG. 2E is a cross-sectional view showing a step of forming a lower electrode material layer, a resistance-variable material layer, and an upper electrode material layer so as to cover the contact plug. FIG. 2F is a cross-sectional view showing a step of forming a resistance-variable element by pattering the lower electrode material layer, the resistance-variable material layer, and the upper electrode material layer. The method for manufacturing the nonvolatile memory device according to the first reference embodiment will be described with reference to FIGS. 2A to 2F.

First, as shown in FIG. 2A, an insulating layer 11 is formed on a substrate (not shown) composed of silicon or the like. More specifically, the insulating layer 11 can be formed by, for example, depositing silicon oxide ($SiO_2$) having a thickness of 100 nm or more and 500 nm or less by thermal oxidation, plasma CVD, or the like.

Next, as shown in FIG. 2B, an oxygen diffusion prevention layer 12 is formed on the insulating layer 11 to cover the insulating layer 11. More specifically, the oxygen diffusion prevention layer 12 is formed by, for example, depositing silicon nitride having a thickness of 30 nm or more and 200 nm or less by CVD.

Next, as shown in FIG. 2C, a contact hole 13' is formed so as to penetrate through the oxygen diffusion prevention layer 12 and at least a part of the insulating layer 11. In the example shown in FIG. 2C, the contact hole 13' is formed so as to penetrate through the oxygen diffusion prevention layer 12 and the insulating layer 11. The contact hole 13' can be formed by, for example, etching with a desired mask. The patterning of the mask can be performed by, for example, using a photoresist.

Next, as shown in FIG. 2D, a contact plug 13 is formed so as to penetrate through the oxygen diffusion prevention layer 12 and at least a part of the insulating layer 11 by filling the contact hole 13' with a conductor material. In the example shown in FIG. 2D, the contact plug 13 is formed so as to penetrate through the oxygen diffusion prevention layer 12 and the insulating layer 11. The contact plug 13 can be formed by, for example, a deposition by sputtering, CVD, plating, or the like and a chemical mechanical process (CMP). Through this step, on the surface of the oxygen diffusion prevention layer 12, the contact plug 13 is exposed on a top end surface of the contact hole 13'.

Next, as shown in FIG. 2E, a lower electrode layer 17' is formed so as to cover the entire surface of the contact plug exposed on the surface of the oxygen diffusion prevention layer and to be electrically connected to the contact plug. A resistance-variable material layer 18' and an upper electrode layer 19' are further formed thereon in that order.

Specifically, for example, the lower electrode layer 17' (thickness: 30 nm) composed of tantalum nitride, the resistance-variable material layer 18' (thickness: 50 nm) composed of an oxygen-deficient tantalum oxide, and the upper electrode layer 19' (thickness: 50 nm) containing iridium are deposited so as to be horizontally laminated in that order.

The lower electrode layer 17' and the upper electrode layer 19' can be formed by, for example, a sputtering method or the like.

The resistance-variable material layer 18' can be formed by a so-called reactive sputtering method in which sputtering is performed in an atmosphere containing argon gas and oxygen gas using tantalum as a target. In this step, the oxygen concentration in the layer may be controlled to 45 to 65 atomic percent by adjusting the flow rate of oxygen. Thus, the resistivity of a first resistance-variable material layer can be adjusted to 0.5 to 20 mΩ·cm (for example, a first resistance-variable material layer having a resistivity of about 2 mΩ·cm can be formed by controlling the oxygen concentration to 60 atomic percent). Furthermore, by conducting oxidation of the first resistance-variable material layer, a $Ta_2O_5$ layer having a thickness in the range of 2 to 12 nm may be formed, as a second resistance-variable material layer having a higher oxygen content, on an outermost surface layer of the first resistance-variable material layer composed of an oxygen-deficient oxide.

Next, the lower electrode layer 17', the resistance-variable material layer 18', and the upper electrode layer 19' that are shown in FIG. 2E are patterned. Thus, as shown in FIG. 2F, a resistance-variable element 10 is formed so as to cover the entire surface of the contact plug 13 exposed on the surface of the oxygen diffusion prevention layer 12 and to be electrically connected to the contact plug 13. For example, a hardmask layer (not shown, which can be formed by photolithography) which is a conductive layer and composed of any of titanium nitride and titanium aluminum nitride (for example, titanium aluminum nitride) is formed on the upper electrode layer 19', and patterning is performed by using this hardmask layer.

Through the above steps, the nonvolatile memory device 100 is produced.

(Second Reference Embodiment)

A second reference embodiment will now be described as a modification of the nonvolatile memory device according to the first reference embodiment. In the nonvolatile memory device of the second reference embodiment, the oxygen diffusion prevention layer in the nonvolatile memory device of the first reference embodiment is continuously formed so as to fill a gap between adjacent contact plugs when viewed in a thickness direction of the insulating layer. In this structure, the process can be simplified. In addition, oxidation of the contact plugs can be more effectively suppressed by the oxygen diffusion prevention layer that is continuously formed so as to fill the gap between the contact plugs.

Figure 3:
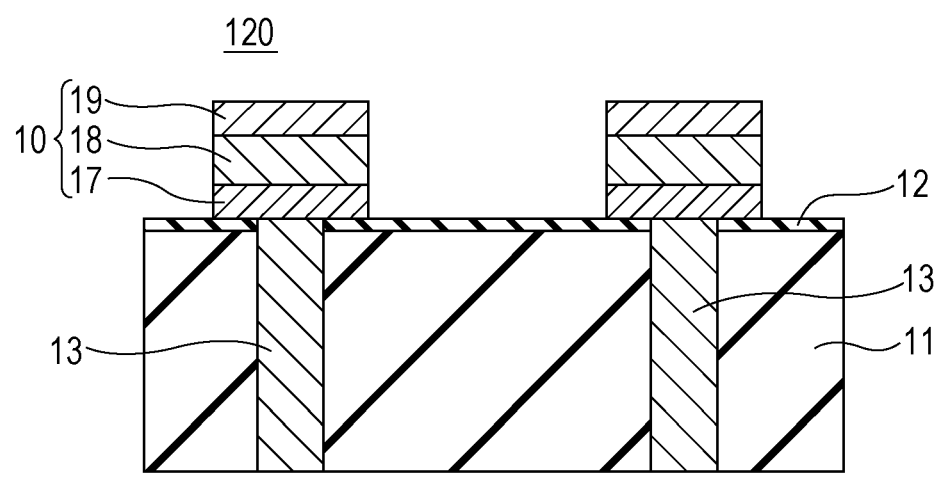
FIG. 3 is a cross-sectional view showing a schematic structure of a nonvolatile memory device according to a second reference embodiment.

FIG. 3 is a cross-sectional view showing a schematic structure of a nonvolatile memory device according to the second reference embodiment. A nonvolatile memory device 120 according to the second reference embodiment will be described with reference to FIG. 3.

In the nonvolatile memory device 120, an oxygen diffusion prevention layer 12 is continuously formed on an insulating layer 11 so as to fill a gap between adjacent contact plugs 13 when viewed in a thickness direction of the insulating layer 11. In the example shown in FIG. 3, the oxygen diffusion prevention layer 12 is formed so as to cover the entire top surface of the insulating layer 11 except for areas where the contact plugs 13 are present.

Except for the above structure, the nonvolatile memory device 120 may have the same structure as the nonvolatile memory device 100 of the first reference embodiment. Accordingly, components common to FIGS. 1 and 3 are assigned the same reference numerals and the same names, and a detailed description of the common components is omitted.

(First Embodiment)

A nonvolatile memory device according to a first embodiment will be described.

In the nonvolatile memory device according to the first embodiment, the oxygen diffusion prevention layer in the nonvolatile memory device of the first reference embodiment is divided so as to correspond to respective contact plugs. Specifically, the nonvolatile memory device includes a plurality of resistance-variable elements and a plurality of contact plugs, in which an oxygen diffusion prevention layer is divided into portions at an interface between an insulating layer and a corresponding resistance-variable element so as to correspond to respective contact plugs arranged for each of the resistance-variable elements. That is, each of the oxygen diffusion prevention layers is provided only between the insulating layer and each of the plurality of the resistance-variable elements to correspond to each of the plurality of the contact plugs arranged for each of the plurality of the resistance-variable elements.

Figure 4A:
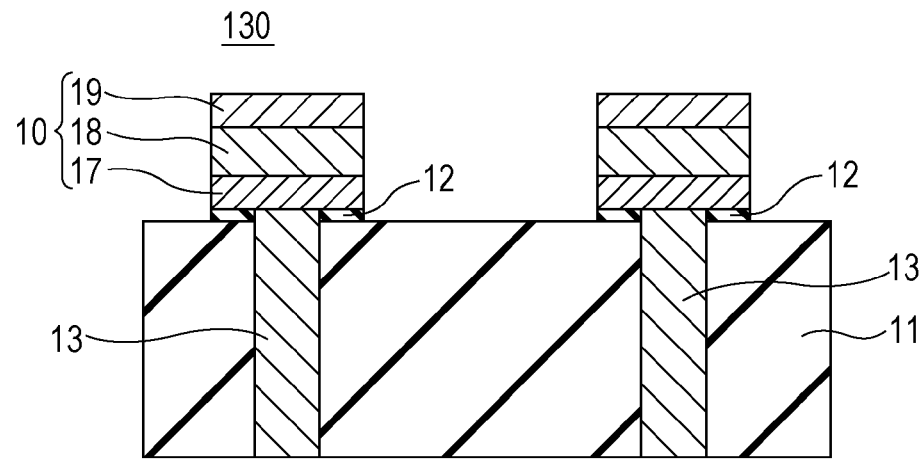
FIG. 4A is a cross-sectional view showing a schematic structure of a nonvolatile memory device according to a first embodiment.
Figure 4B:
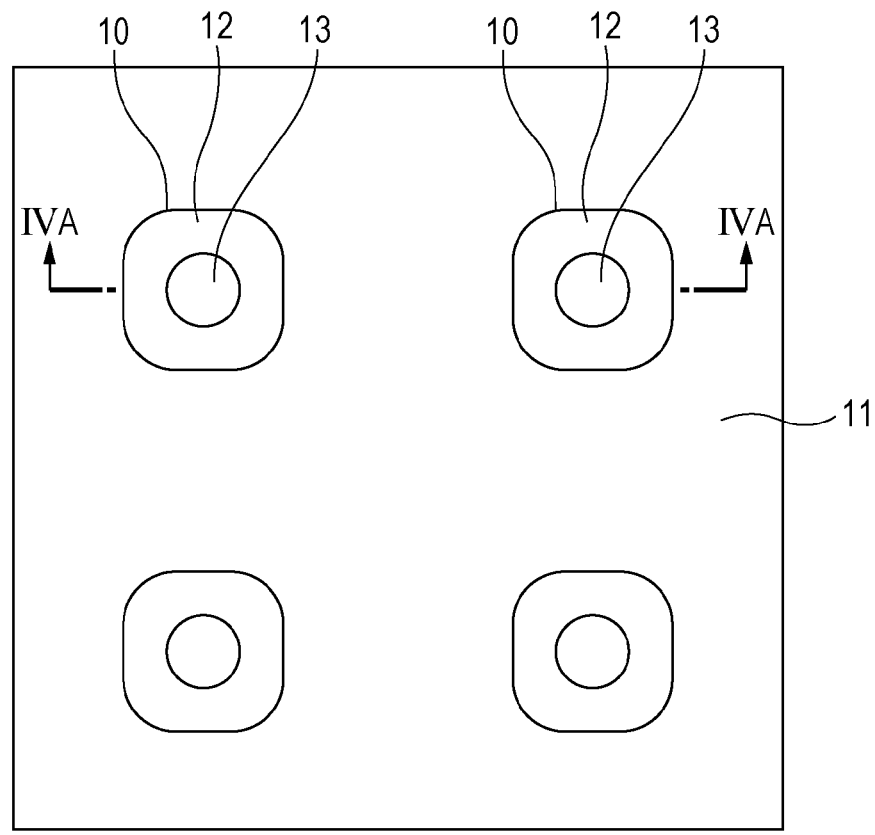
FIG. 4B is a plan view showing a schematic structure of the nonvolatile memory device according to the first embodiment.

FIG. 4A is a cross-sectional view showing a schematic structure of a nonvolatile memory device according to the first embodiment. FIG. 4B is a plan view of the nonvolatile memory device according to the first embodiment. FIG. 4A is a cross-sectional view taken along line IVA-IVA in FIG. 4B, viewed in the arrow direction. A nonvolatile memory device 130 according to the first embodiment will be described with reference to FIGS. 4A and 4B.

The nonvolatile memory device 130 includes a plurality of resistance-variable elements 10 and a plurality of contact plugs 13. The plurality of resistance-variable elements 10 are two-dimensionally arranged on an insulating layer 11 at predetermined intervals. An oxygen diffusion prevention layer 12 is divided into portions at an interface between the insulating layer 11 and the corresponding resistance-variable element 10 so as to correspond to each of the contact plugs 13 arranged for each of the corresponding resistance-variable elements 10. In this structure, the oxygen diffusion prevention layer 12 may be composed of a conductive material or a non-conductive material. In the example shown in FIGS. 4A and 4B, when the resistance-variable element 10 is viewed in the thickness direction of the insulating layer 11, the oxygen diffusion prevention layer 12 is formed so that the outer periphery of the oxygen diffusion prevention layer 12 is flush with the outer periphery of the corresponding resistance-variable element 10. Moreover, the resistance-variable elements 10 are each formed so that, when the resistance-variable element 10 is viewed in the thickness direction of the insulating layer 11, the oxygen diffusion prevention layer 12 overlaps the resistance-variable element 10. Alternatively, the outer periphery of the oxygen diffusion prevention layer 12 may not be flush with the outer periphery of the resistance-variable element 10. For example, when the resistance-variable element 10 is viewed in the thickness direction of the insulating layer 11, the oxygen diffusion prevention layer 12 may be larger than the resistance-variable element 10.

Except for the above structure, the nonvolatile memory device 130 may have the same structure as the nonvolatile memory device 100 of the first reference embodiment. Accordingly, components common to FIG. 1 and FIGS. 4A and 4B are assigned the same reference numerals and the same names, and a detailed description of the common components is omitted.

In the nonvolatile memory device, the oxygen diffusion prevention layer 12 may be composed of at least one selected from the group consisting of nitrides, oxygen-deficient silicon oxides, oxygen-deficient aluminum oxides, and oxygen-deficient titanium oxides.

With this structure, the possibility in which oxygen reaches contact plugs in an oxidation process is decreased, and oxidation of the contact plugs can be suppressed.

A method similar to the method for manufacturing the nonvolatile memory device according to the first reference embodiment can be applied to the nonvolatile memory device of the first embodiment. In the method for manufacturing the nonvolatile memory device according to the first reference embodiment, the steps shown in FIGS. 2A to 2E are performed in the same manner. In the step shown in FIG. 2E, resistance-variable elements 10 are formed by patterning the lower electrode layer 17', the resistance-variable material layer 18', and the upper electrode layer 19'. Subsequently, the peripheral edge of the resistance-variable layer is subjected to a heat treatment in an oxygen-containing atmosphere or a plasma treatment in an oxygen-containing atmosphere. Subsequently, the oxygen diffusion prevention layer 12 is etched so that the oxygen diffusion prevention layer 12 is divided into portions so as to correspond to each of the contact plugs arranged for the respective resistance-variable elements.

According to the above method, in the step of conducting a heat treatment on the peripheral edge of the resistance-variable layer in an oxygen-containing atmosphere or a plasma treatment on the peripheral edge of the resistance-variable layer in an oxygen-containing atmosphere, the oxygen diffusion prevention layer 12, which is larger than the diameter of each of the resistance-variable elements 10, covers the surface of the insulating layer 11 so as to correspond to each of the contact plugs 13 arranged for the respective resistance-variable elements 10. Accordingly, it is possible to suppress the phenomenon that oxygen during the oxidation reaches the contact plugs 13 through the insulating layer 11. Consequently, oxidation of the contact plugs 13 can be suppressed.

In the structure of the second reference embodiment (shown in FIG. 3), in the case where the oxygen diffusion prevention layer is continuously formed on the top surface of the insulating layer so as to fill a gap between adjacent contact plugs viewed in the thickness direction of the insulating layer, the oxygen diffusion prevention layer needs to be formed by using a non-conductive material so that adjacent resistance-variable elements are not electrically short-circuited. In contrast, in the structure of the first embodiment, the oxygen diffusion prevention layer is divided into portions so as to correspond to adjacent resistance-variable elements. Therefore, the oxygen diffusion prevention layer can be formed by using a conductive material.

In addition, since the oxygen diffusion prevention layer 12 is divided so as to correspond to adjacent resistance-variable elements 10, the oxygen diffusion prevention layer 12 is not provided on the insulating layer 11 located between the adjacent resistance-variable elements 10. In the case where the oxygen diffusion prevention layer 12 is continuously formed between adjacent resistance-variable elements 10 by using a so-called Hi-k material (such as silicon nitride) having a high dielectric constant, a parasitic capacitance between a lower wiring (not shown) formed on the lower side of the insulating layer 11 and an upper wiring (not shown) formed on the upper side of a resistance-variable element 10 becomes large. However, with the structure of the first embodiment, the parasitic capacitance is decreased. As a result, reliability and a high-speed performance of the nonvolatile memory device is enhanced.

(Second Embodiment)

In a nonvolatile memory device according to a second embodiment, each of the resistance-variable elements in the nonvolatile memory device of the first embodiment includes a sidewall protection layer that covers a sidewall of the resistance-variable element and that is composed of an insulating material. When the resistance-variable element is viewed in a thickness direction of an insulating layer, an outer periphery of the sidewall protection layer is flush with an outer periphery of an oxygen diffusion prevention layer. In addition, the sidewall protection layer overlaps the oxygen diffusion prevention layer when the resistance-variable element is viewed in the thickness direction of the insulating layer.

In the nonvolatile memory device according to the second embodiment, each of the resistance-variable elements includes a sidewall protection layer, and the oxygen diffusion prevention layer is not formed on the insulating layer located between adjacent resistance-variable elements.

Figure 5:
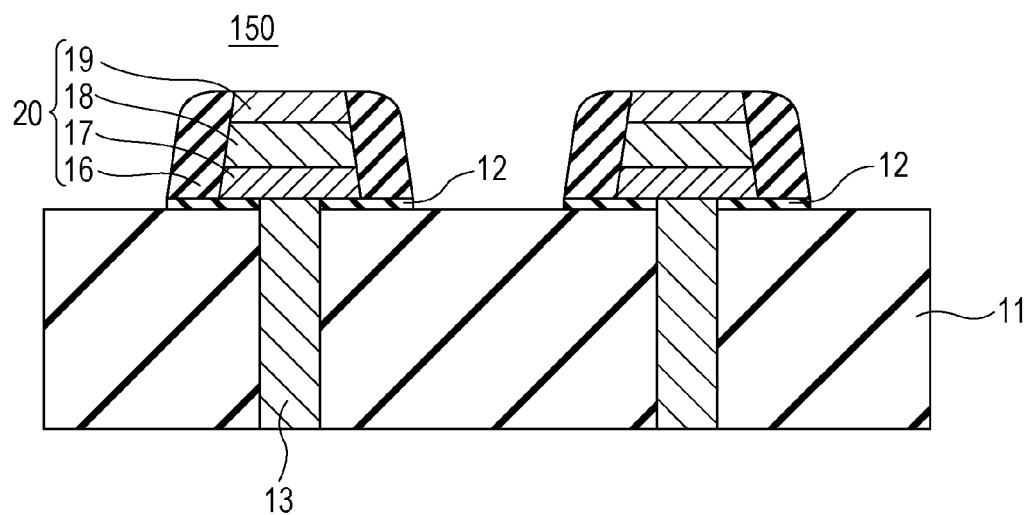
FIG. 5 is a cross-sectional view showing a schematic structure of a nonvolatile memory device according to a second embodiment.

FIG. 5 is a cross-sectional view showing a schematic structure of a nonvolatile memory device according to the second embodiment. A plan view of the nonvolatile memory device according to the second embodiment is omitted. However, similarly to the first embodiment shown in FIG. 4B, a nonvolatile memory device 150 includes a plurality of resistance-variable elements 20 and a plurality of contact plugs 13, and the resistance-variable elements 20 are two-dimensionally arranged on an insulating layer 11 at predetermined intervals. The nonvolatile memory device 150 according to the second embodiment will be described with reference to FIG. 5.

The nonvolatile memory device 150 includes resistance-variable elements 20 each including a sidewall protection layer 16. The sidewall protection layer 16 covers the entire periphery of sidewalls of a lower electrode 17, a resistance-variable layer 18, and an upper electrode 19 that form a resistance-variable element 20, and is composed of an insulating material. More specifically, for example, the sidewall protection layer 16 covers at least the sidewall of the lower electrode 17 and the sidewall of the resistance-variable layer 18, and has an insulating property. Furthermore, the sidewall protection layer 16 may cover the sidewall of the upper electrode 19.

With this structure, for example, in a structure including a wiring, a contact plug, and the like that are formed above an element, when the wiring, the contact plug, and the like are formed in a misaligned manner, it is possible to reduce the possibility in which the wiring is short-circuited between the upper electrode and the lower electrode.

The sidewall protection layer 16 may be formed of, for example, a silicon nitride film having a thickness of 10 to 50 nm.

The top end of the sidewall protection layer 16 may extend so as to be higher than a plane specified by the top surface of the upper electrode 19.

Instead of silicon nitride, the sidewall protection layer 16 may be composed of an oxide, a nitride, or an oxynitride (such as aluminum oxide or titanium oxide) having an insulating property and an oxygen barrier property.

In the nonvolatile memory device 150 according to the second embodiment, an oxygen diffusion prevention layer 12 is divided into portions so as to correspond to the respective contact plugs 13. In the example shown in FIG. 5, each of the resistance-variable elements 20 include a sidewall protection layer that covers a sidewall of each of the resistance-variable element 20 and that is composed of an insulating material. Furthermore, the resistance-variable elements are each formed so that, when the resistance-variable element 20 is viewed in the thickness direction of the insulating layer 11, the outer periphery of the oxygen diffusion prevention layer 12 is flush with the outer periphery of the resistance-variable element 20 (i.e., the shape of the outer edge of the sidewall protection layer 16). Moreover, the resistance-variable elements 20 are each formed so that, when the resistance-variable element 20 is viewed in the thickness direction of the insulating layer 11, the oxygen diffusion prevention layer 12 overlaps the resistance-variable element 20.

With this structure, since the oxygen diffusion prevention layer is pattered by using the sidewall protection layer as a mask, the number of the masks is decreased.

The outer periphery of the oxygen diffusion prevention layer 12 may not be flush with the outer periphery of the resistance-variable element 20, and may be different from the outer periphery of the resistance-variable element 20. For example, when the resistance-variable element 20 is viewed in the thickness direction of the insulating layer 11, the oxygen diffusion prevention layer 12 may be larger than the resistance-variable element 20.

Except for the above structure, the nonvolatile memory device 150 may have the same structure as the nonvolatile memory device 130 according to the first embodiment. Accordingly, components common to FIG. 1 and FIG. 5 are assigned the same reference numerals and the same names, and a detailed description of the common components is omitted.

A method similar to the methods for manufacturing the nonvolatile memory devices according to the first reference embodiment and the first embodiment can be applied to the nonvolatile memory device of the second embodiment.

Specifically, in the method for manufacturing the nonvolatile memory device according to the first reference embodiment, the steps shown in FIGS. 2A to 2F are performed in the same manner. The method for manufacturing a nonvolatile memory device according to the second embodiment further includes, after the step of forming resistance-variable elements by patterning a lower electrode material layer, a resistance-variable material layer, and an upper electrode material layer, the step being shown in FIG. 2F, a step of forming a sidewall protection layer composed of an insulating material so as to cover sidewalls of the resistance-variable elements. The step of dividing the oxygen diffusion prevention layer into portions includes removing a part of the oxygen diffusion prevention layer, the part being other than a part covered with the sidewall protection layer, so as to correspond to the respective contact plugs arranged for the corresponding each of the resistance-variable elements by using the sidewall protection layer as a mask. In this case, before the step of forming the sidewall protection layer, the peripheral edge of the resistance-variable layer may be oxidized by a heat treatment in an oxygen-containing atmosphere or by a plasma treatment in an oxygen-containing atmosphere.

In the nonvolatile memory device according to the second embodiment, each of the sidewall protection layers composed of an insulating material is formed so as to cover the sidewall of each of the resistance-variable elements. In this case, for example, in a structure in which a wiring, a contact plug, and the like are formed above a resistance-variable element, when the upper wiring, the upper contact plug, and the like are formed in a misaligned manner, it is possible to reduce the possibility in which the wiring is short-circuited with the resistance-variable layer and the lower electrode of the resistance-variable element disposed below the wiring.

In the nonvolatile memory device, the sidewall protection layer and the oxygen diffusion prevention layer may be composed of the same material.

According to this structure, the sidewall protection layer also has an effect of preventing oxygen diffusion. Therefore, even in the case where a heat treatment process that is performed in known semiconductor processes is conducted, it is possible to prevent oxygen that is diffused from an interlayer insulating layer or the like from entering the resistance-variable layer included in the resistance-variable element. Consequently, the oxygen content of the resistance-variable layer can be stabilized. Furthermore, the sidewall protection layer and the oxygen diffusion prevention layer can be deposited with the same apparatus and under the same conditions, and thus the manufacture cost can be reduced. Furthermore, in the case where the oxygen diffusion prevention layer is divided into portions at the same time when the sidewall protection layer is formed, the sidewall protection layer and the oxygen diffusion prevention layer can be etched at one time.

In the structure according to the second embodiment, since the oxygen diffusion prevention layer is divided into portions so as to correspond to adjacent resistance-variable elements, the oxygen diffusion prevention layer can be formed by using a conductive material.

(Third Embodiment)

In a nonvolatile memory device according to a third embodiment, a sidewall portion of the resistance-variable layer in the nonvolatile memory device of the first embodiment is oxidized by a heat treatment in an oxygen-containing atmosphere or a plasma treatment in an oxygen-containing atmosphere.

With this structure, by reducing an active area (i.e., effective area that affects electrical properties of an element), a leakage current is decreased, the breakdown voltage is made constant, and the application time is reduced.

Figure 6:
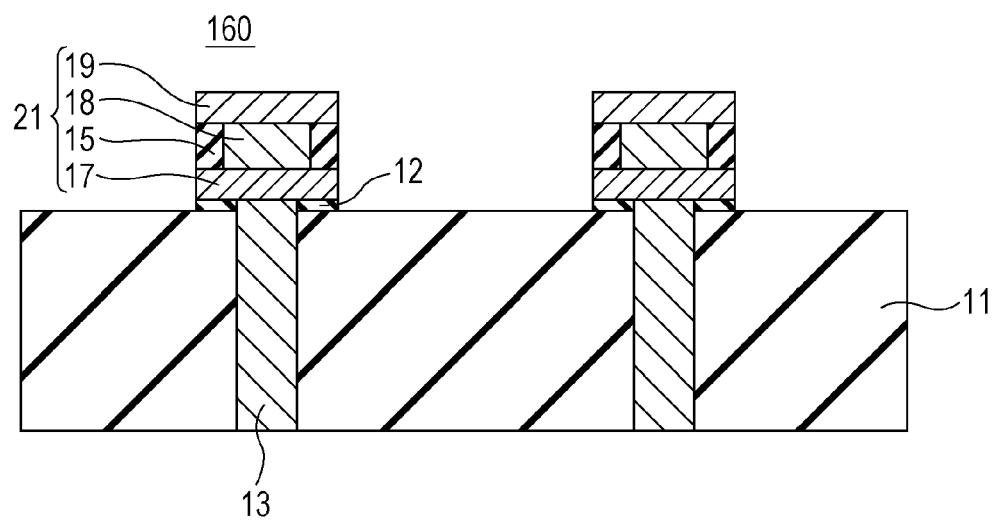
FIG. 6 is a cross-sectional view showing a schematic structure of a nonvolatile memory device according to a third embodiment.

FIG. 6 is a cross-sectional view showing a schematic structure of a nonvolatile memory device according to the third embodiment. A plan view of the nonvolatile memory device according to the third embodiment is omitted. However, similarly to the first embodiment shown in FIG. 4B, a nonvolatile memory device 160 includes a plurality of resistance-variable elements 21 and a plurality of contact plugs 13, and the resistance-variable elements 21 are two-dimensionally arranged on an insulating layer 11 at predetermined intervals. The nonvolatile memory device 160 according to the third embodiment will be described with reference to FIG. 6.

In the nonvolatile memory device 160, the entire periphery of a sidewall portion of a resistance-variable layer 18 is oxidized by a heat treatment in an oxygen-containing atmosphere or by a plasma treatment in an oxygen-containing atmosphere. In the example shown in FIG. 6, an outer peripheral portion of the resistance-variable layer 18 is changed to an insulating region 15 by the oxidation.

A method similar to the method for manufacturing the nonvolatile memory device according to the first embodiment can be applied to the nonvolatile memory device of the third embodiment. The method for manufacturing the nonvolatile memory device according to the third embodiment includes, after the patterning of a lower electrode layer 17, a resistance-variable material layer 18', and an upper electrode layer 19' and before the patterning of an oxygen diffusion prevention layer in the method for manufacturing the nonvolatile memory device according to the first embodiment, a step of oxidizing the peripheral edge of the resistance-variable layer by conducting a heat treatment in an oxygen-containing atmosphere or by a plasma treatment in an oxygen-containing atmosphere.

The nonvolatile memory device according to the third embodiment has the same advantages as those of the first embodiment. Furthermore, according to the nonvolatile memory device according to the third embodiment, by changing the outer peripheral portion of the resistance-variable layer to an insulating region and reducing the active area (i.e., effective area that affects electrical properties of the element), a leakage current is decreased, the breakdown voltage is made constant, and the application time is reduced.

The method for manufacturing the nonvolatile memory device according to the third embodiment may include, after the above-described step of oxidation, a step of forming a sidewall protection layer composed of an insulating material so as to cover sidewalls of resistance-variable elements, as described in the second embodiment.

Figure 7:
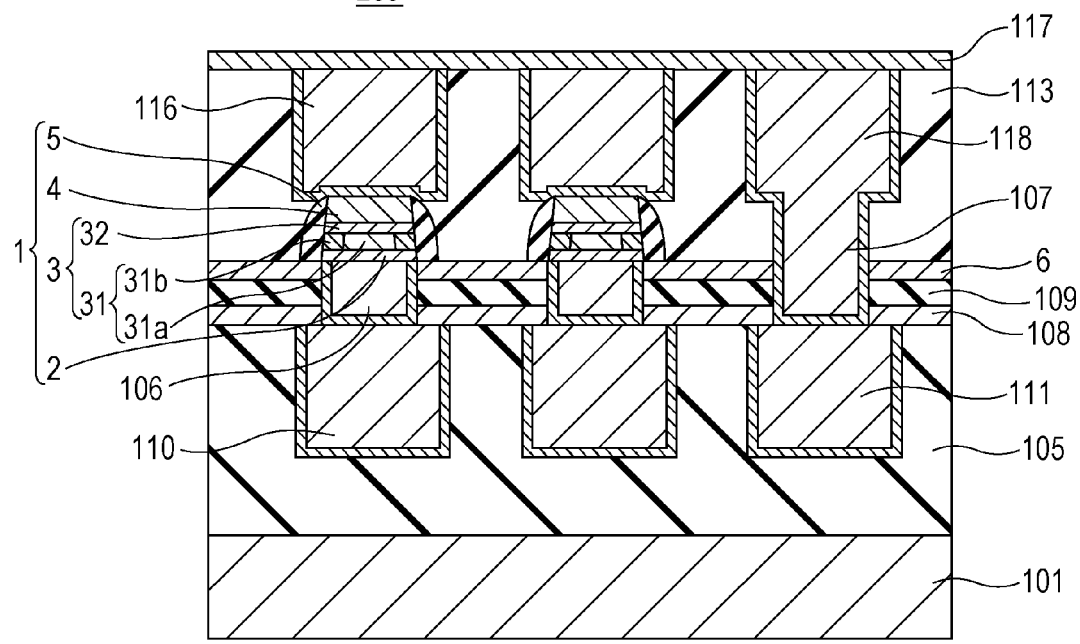
FIG. 7 is a cross-sectional view showing a schematic structure of a nonvolatile memory device according to Reference Example.

[Reference Example]
<Device Structure>
FIG. 7 is a cross-sectional view showing a schematic structure of a nonvolatile memory device according to Reference Example. A nonvolatile memory device 200 of Reference Example will be described with reference to FIG. 7.

As shown in FIG. 7, the nonvolatile memory device 200 includes a substrate 101 in which a transistor etc. are formed and a first interlayer insulating layer 105 disposed on the substrate 101. A first wiring 110 and a second wiring 111 are formed in the first interlayer insulating layer 105. A first liner layer 108 is formed on the first interlayer insulating layer 105, the first wiring 110, and the second wiring 111.

A first contact plug 106 is formed in the first liner layer 108, a second interlayer insulating layer 109, and an oxygen diffusion prevention layer 6 so as to be connected to the first wiring 110. The first contact plug 106 is connected to a lower electrode 2. The lower electrode 2, a resistance-variable layer 3, and an upper electrode 4 form a resistance-variable element 1. A third wiring 116 is formed in a third interlayer insulating layer 113 provided between adjacent resistance-variable elements 1 and upper portions thereof.

A second contact plug 107 is formed in the first liner layer 108, the second interlayer insulating layer 109, the oxygen diffusion prevention layer 6, and the third interlayer insulating layer 113 so as to be connected to the second wiring 111. A fourth wiring 118 is formed in the third interlayer insulating layer 113 so as to be connected to the second contact plug 107.

A passivation film 117 for protecting the device from entering of moisture, ions, and the like from the outside is formed on the third wiring 116, the fourth wiring 118, and the third interlayer insulating layer 113.

The resistance-variable element 1 in Reference Example is formed on the oxygen diffusion prevention layer 6 and the first contact plug 106.

More specifically, the first wiring 110 and the second wiring 111 are each formed on a barrier metal layer formed in a wire trench that is formed in the first interlayer insulating layer 105 so that the trench is completely filled with, for example, copper or the like. The barrier metal layer may be formed by, for example, sequentially depositing a tantalum nitride layer having a thickness of 5 nm or more and 40 nm or less and a tantalum layer having a thickness of 5 nm or more and 40 nm or less.

The first liner layer 108 is formed on the first interlayer insulating layer 105 including the first wiring 110 and the second wiring 111. The first liner layer 108 is formed of, for example, a silicon nitride layer having a thickness of 30 nm or more and 200 nm or less.

The second interlayer insulating layer 109 is formed on the first liner layer 108 and is formed of, for example, a silicon oxide layer having a thickness of 100 nm or more and 500 nm or less.

The oxygen diffusion prevention layer 6 is formed on the second interlayer insulating layer 109 and is formed of, for example, a silicon nitride layer having a thickness of 30 nm or more and 200 nm or less.

The first contact plug 106 that is electrically connected to the first wiring 110 is formed in the first liner layer 108, the second interlayer insulating layer 109, and the oxygen diffusion prevention layer 6 so as to penetrate through these layers. The first contact plug 106 is formed on a barrier metal layer formed in a contact hole that is formed in the first liner layer 108, the second interlayer insulating layer 109, and the oxygen diffusion prevention layer 6 so that the contact hole is completely filled with, for example, copper or the like. The barrier metal layer is formed by, for example, sequentially depositing a tantalum nitride layer having a thickness of 5 nm or more and 40 nm or less and a tantalum layer having a thickness of 5 nm or more and 40 nm or less. The first contact plug 106 is formed, for example, so as to have a diameter of 50 nm or more and 200 nm or less.

The resistance-variable element 1 is formed above the oxygen diffusion prevention layer 6 and is electrically and physically connected to the first contact plug 106. The resistance-variable element 1 includes the lower electrode 2, the upper electrode 4, and the resistance-variable layer 3 interposed between the lower electrode 2 and the upper electrode 4. The resistance value of the resistance-variable layer 3 changes reversibly on the basis of an electrical signal applied between the upper electrode 4 and the lower electrode 2. The resistance-variable layer 3 includes a first resistance-variable layer 31 composed of an oxygen-deficient metal oxide and a second resistance-variable layer 32 composed of a metal oxide having an oxygen content higher than that of the first resistance-variable layer 31. The first resistance-variable layer 31 includes a first area 31a composed of an oxygen-deficient metal oxide and a second area 31b disposed on the periphery of the first area 31a and having an oxygen content higher than that of the first area 31a.

The resistance-variable layer 3 in Reference Example contains a metal oxide whose resistance value increases with an increase in the oxygen content. Accordingly, by providing an electrical signal to the resistance-variable element 1, in addition to a high-speed resistance change operation, reversibly stable rewrite characteristics and satisfactory retention characteristics can be obtained. Furthermore, by using this resistance-variable layer 3 and optimizing the oxygen content of the resistance-variable layer 3 and the distribution (profile) of the oxygen content, a high-speed operation by an electrical signal having a short pulse width (for example, 100 ns or less) can be realized. Furthermore, according to this resistance-variable layer 3, the width of the resistance change can also be increased (the difference can be increased to one order of magnitude or more), and a signal readout margin can be increased.

The phrase "the resistance-variable layer 3 contains a metal oxide whose resistance value increases with an increase in the oxygen content" means that a metal oxide whose resistance value increases with an increase in the oxygen content is dominantly present in the material constituting the resistance-variable layer 3, and a trace amount of impurities or additives may be contained to the extent that the resistance change operation of the resistance-variable layer 3 is not affected. A small amount of other elements may be intentionally contained in the resistance-variable layer 3 for the purpose of, for example, finely adjusting the resistance value of the resistance-variable layer 3. For example, by adding nitrogen to the resistance-variable layer 3 composed of a metal oxide, the resistance value of the resistance-variable layer 3 is increased and the reactivity of the resistance change operation can be improved.

A resistance change is caused as follows. In the vicinity of an interface between the resistance-variable layer 3 and one of the lower electrode 2 and the upper electrode 4, which sandwich the resistance-variable layer 3, oxygen ions are collected, by an electric field, in a site in the vicinity of the interface of the resistance-variable layer 3, or the collected oxygen ions diffuse. Specifically, for example, in a bipolar-type nonvolatile memory device in which a voltage (electric pulse) having a different polarity is applied between the lower electrode 2 and the upper electrode 4, when a voltage that is positive with respect to another electrode is applied to one electrode, oxygen ions that are negatively charged are collected in a site in the vicinity of the interface between the resistance-variable layer 3 and the one electrode. Consequently, a high-resistance layer is formed on the site, and the resistance of the resistance-variable layer 3 in the site becomes high. On the other hand, when a voltage that is negative with respect to the other electrode is applied to the one electrode, oxygen ions that are collected in the site in the vicinity of the interface between the resistance-variable layer 3 and the one electrode diffuse from the site into the resistance-variable layer 3. Consequently, the resistance of the resistance-variable layer 3 in the site in the vicinity of the interface between the resistance-variable layer 3 and the one electrode becomes low. Oxygen ions in the site in the vicinity of the interface diffuse in another site of the resistance-variable layer 3. However, the volume of the other site of the resistance-variable layer 3 is significantly larger than the volume of the site in the vicinity of the interface. Therefore, the oxygen ions do not significantly increase the resistance value of the other site of the resistance-variable layer 3.

The resistance-variable element 1 of Reference Example can be applied to a unipolar-type nonvolatile memory device in which only a voltage (electric pulse) having the same polarity is applied between the lower electrode 2 and the upper electrode 4, and a high-resistance state and a low-resistance state are switched by changing the magnitude of the voltage (intensity of the electric pulse) and/or the time during which the voltage is applied (pulse width of the electric pulse).

The resistance-variable layer 3 has a structure in which at least the first resistance-variable layer 31 connected to the lower electrode 2 and the second resistance-variable layer 32 connected to the upper electrode 4 are laminated. The first resistance-variable layer 31 has a thickness of, for example, about 10 nm or more and 100 nm or less. The second resistance-variable layer 32 has a thickness of, for example, about 1 nm or more and 10 nm or less.

The first resistance-variable layer 31 is composed of an oxygen-deficient first metal oxide. The second resistance-variable layer 32 is composed of a second metal oxide having a degree of oxygen deficiency smaller than that of the first metal oxide. In the second resistance-variable layer 32, a fine local area whose degree of oxygen deficiency changes reversibly in accordance with application of an electrical signal (electric pulse) is formed. It is believed that the local area includes filaments constituted by an oxygen deficiency site.

It is believed that the resistance change phenomenon in the resistance-variable layer 3 having the laminated structure is caused as follows. An oxidation-reduction reaction occurs in the fine local area formed in the second resistance-variable layer 32 containing the second metal oxide having a high resistance, and the filaments (conductive paths) in the local area are changed. Consequently, the resistance value of the second resistance-variable layer 32 is changed.

Specifically, when a voltage that is positive with respect to the lower electrode 2 is applied to the upper electrode 4 connected to the second resistance-variable layer 32 containing the second metal oxide, oxygen ions in the resistance-variable layer 3 are attracted to the second resistance-variable layer 32 side. Consequently, an oxidation reaction occurs in the fine local area formed in the second resistance-variable layer 32, and the degree of oxygen deficiency decreases (the oxygen content increases). As a result, it is believed that it becomes difficult for the filaments in the local area to be connected to each other, and the resistance value increases.

On the other hand, when a voltage that is negative with respect to the lower electrode 2 is applied to the upper electrode 4 connected to the second resistance-variable layer 32 containing the second metal oxide, oxygen ions in the second resistance-variable layer 32 are pushed to the first resistance-variable layer 31 side. Consequently, a reduction reaction occurs in the fine local area formed in the second resistance-variable layer 32, and the degree of oxygen deficiency increases (the oxygen content decreases). As a result, it is believed that it becomes easy for the filaments in the local area to be connected to each other, and the resistance value decreases.

In Reference Example, as an example of the resistance-variable layer 3, the same metal oxide is used as the first metal oxide contained in the first resistance-variable layer 31 and the second metal oxide contained in the second resistance-variable layer 32. For example, each of the first resistance-variable layer 31 and the second resistance-variable layer 32 contains a tantalum oxide. When the composition of a first tantalum oxide contained in the first resistance-variable layer 31 is represented by $TaO_x$ and the composition of a second tantalum oxide contained in the second resistance-variable layer 32 is represented by $TaO_y$, the relationship $0<x<2.5$ and the relationship $x<y$ are satisfied. That is, the first resistance-variable layer 31 and the second resistance-variable layer 32 are formed so that the oxygen content in the second tantalum oxide $TaO_y$ is larger than the oxygen content in the first tantalum oxide $TaO_x$. Furthermore, the first tantalum oxide layer $TaO_x$ may satisfies $0.8 \leq x \leq 1.9$, and the second tantalum oxide layer $TaO_y$ may satisfies $2.1 \leq y < 2.5$.

Metals other than tantalum may be used as the metal contained in the resistance-variable layer 3. Examples of the metals contained in the resistance-variable layer 3 include transition metals and aluminum (Al). Examples of the transition metals include tantalum (Ta), titanium (Ti), hafnium (Hf), zirconium (Zr), niobium (Nb), tungsten (W), and nickel (Ni). Since transition metals can be in a plurality of oxidation states, different resistance states can be realized by an oxidation-reduction reaction.

In the case where hafnium oxides are used, when the composition of the first metal oxide contained in the first resistance-variable layer 31 is represented by $HfO_x$ and the composition of the second metal oxide contained in the second resistance-variable layer 32 is represented by $HfO_y$, the relationship $0<x<2.0$ and the relationship $x<y$ may be satisfied. Furthermore, the first hafnium oxide $HfO_x$ may satisfy $0.9 \leq x \leq 1.6$, and the second hafnium oxide $HfO_y$ may satisfy $1.8<y<2.0$.

In the case where zirconium oxides are used, when the composition of the first metal oxide contained in the first resistance-variable layer 31 is represented by $ZrO_x$ and the composition of the second metal oxide contained in the second resistance-variable layer 32 is represented by $ZrO_y$, the relationship $0<x<2.0$ and the relationship $x<y$ may be satisfied. Furthermore, the first zirconium oxide $ZrO_x$ may satisfy $0.9 \leq x \leq 1.4$, and the second zirconium oxide $ZrO_y$ may satisfy $1.9<y<2.0$.

Different metals may be used as the first metal contained in the first metal oxide and the second metal contained in the second metal oxide. In this case, the second metal oxide may have a degree of oxygen deficiency smaller than that of the first metal oxide, that is, may have a resistance higher than that of the first metal oxide. With this structure, a voltage applied between the lower electrode 2 and the upper electrode 4 at the time of a change in the resistance is distributed to the second metal oxide in a larger amount. Thus, an oxidation-reduction reaction that occurs in the second metal oxide can be more easily induced.

In the case where different materials are used as the first metal in the first metal oxide contained in the first resistance-variable layer 31 and the second metal in the second metal oxide contained in the second resistance-variable layer 32, the standard electrode potential of the second metal may be lower than the standard electrode potential of the first metal. The higher the standard electrode potential is, the lower the degree of oxidation is. Accordingly, an oxidation-reduction reaction easily occurs in the second metal oxide having a relatively low standard electrode potential.

For example, an operation of stable resistance change can be achieved by using an oxygen-deficient tantalum oxide ($TaO_x$) as the first metal oxide and using titanium oxide ($TiO_2$) as the second metal oxide. Titanium (standard electrode potential=1.63 eV) is a material having a standard electrode potential lower than that of tantalum (standard electrode potential=−0.6 eV). By using, as the second metal oxide, an oxide of a metal having a standard electrode potential lower than that of a metal contained in the first metal oxide, an oxidation-reduction reaction more easily occurs in the second metal oxide. Instead of titanium oxide, aluminum oxide ($Al_2O_3$) may be used as the second metal oxide functioning as a high-resistance layer. For example, an oxygen-deficient tantalum oxide ($TaO_x$) may be used as the first metal oxide, and aluminum oxide ($Al_2O_3$) may be used as the second metal oxide.

According to the above structure, the upper electrode 4 is connected to the second resistance-variable layer 32 composed of the second metal oxide having a smaller degree of oxygen deficiency. This upper electrode 4 is composed of a material having a standard electrode potential higher than that of the metal contained in the second metal oxide and the material of the lower electrode 2. For example, the upper electrode 4 is composed of a noble metal such as platinum (Pt), iridium (Ir), or palladium (Pd).

The lower electrode 2 is connected to the first resistance-variable layer 31 composed of the first metal oxide having a larger degree of oxygen deficiency. The lower electrode 2 is composed of a material having a standard electrode potential lower than that of the metal contained in the first metal oxide. For example, the lower electrode 2 is composed of tungsten (W), nickel (Ni), tantalum (Ta), titanium (Ti), aluminum (Al), tantalum nitride (TaN), or titanium nitride (TiN). The lower electrode 2 is formed so as to have a thickness of, for example, about 20 to 100 nm.

The relationships between the standard electrode potentials of materials are summarized as follows. When the standard electrode potential of the upper electrode 4 is represented by V2, the standard electrode potential of a metal contained in the second metal oxide is represented by Vr2, the standard electrode potential of a metal contained in the first metal oxide is represented by Vr1, and the standard electrode potential of the lower electrode 2 is represented by V1, these materials have relationships that satisfy Vr2<V2 and V1<V2. Furthermore, these materials may have relationships that satisfy Vr2<V2 and V1≤Vr1.

The higher the standard electrode potential, the lower the degree of oxidation. Accordingly, since the relationship Vr2<V2 is satisfied, an oxidation-reduction reaction in accordance with an electrical signal applied between the lower electrode 2 and the upper electrode 4 selectively occurs in the second resistance-variable layer 32 of the vicinity of the interface between the upper electrode 4 having a high standard electrode potential and the resistance-variable layer 3 (second resistance-variable layer 32), and a resistance-variable layer having a high oxygen concentration or a low oxygen concentration is formed. Furthermore, since the relationship V1<V2 is satisfied, the oxidation-reduction reaction at the interface between the electrodes preferentially occurs on the upper electrode 4 side. Thus, a stable resistance change phenomenon is obtained in the resistance-variable layer 3.

The resistance-variable layer 3 includes the first area 31$a$ and the second area 31$b$ formed in the periphery of the first area 31$a$ (on an end surface of the resistance-variable layer 3). The second area 31$b$ has a higher oxygen content than the first area 31$a$. The resistance value of the first area 31$a$ is changed by applying an electrical signal (electric pulse) between the upper electrode 4 and the lower electrode 2. The oxygen content of second area 31$b$ is increased by conducting a heat treatment in an oxygen-containing atmosphere or by conducting a plasma treatment in an oxygen-containing atmosphere after the resistance-variable element 1 is formed so as to have a predetermined shape.

The oxygen content of the second area 31$b$ is higher than that of the first area 31$a$. Therefore, the second area 31$b$ has a high resistance value. In addition, an active area (the first area 31$a$ of the resistance-variable layer 3, the first area 31$a$ being formed between the upper electrode 4 and the lower electrode 2 and capable of forming filaments that perform a resistance change operation) of the resistance-variable element 1 is decreased, the breakdown voltage is reduced, and the time for which the breakdown is caused is reduced.

Furthermore, the resistance of the second area 31$b$ is increased by increasing the oxygen content of second area 31$b$ by conducting a heat treatment in an oxygen-containing atmosphere or a plasma treatment in an oxygen-containing atmosphere after a step of forming the resistance-variable element 1. Therefore, the filaments that perform a resistance change operation are not formed on the end surface of the resistance-variable layer 3 to which etching damage is applied during the formation of the resistance-variable element 1, and thus a more stable operation can be obtained.

Examples of the etching damage include the following. In dry etching of an oxide, oxygen is eliminated from the oxide as a result of a reduction action by an etching gas onto an etching edge surface of an etching object that has been subjected to the dry etching, and consequently, the resistance value varies in the etching edge surface of the oxide. In the case where, for example, a mixed gas containing a fluorine-containing gas is used as an etching gas for dry etching, fluorine, which becomes an impurity for an oxide, is implanted from an etching edge surface during etching, and the resistance value varies in the etching edge surface of the oxide.

Accordingly, when a pattern of an oxide that forms a resistance-variable element is formed by dry etching, an etching edge surface of the oxide is subjected to etching damage that varies the resistance value, the etching damage being due to elimination of oxygen, implantation of an impurity, or the like. In an element in which an operation area whose resistance changes is located near an etching edge surface that has been subjected to etching damage, defective operation is caused by an impurity or a variation in the amount of oxygen. Thus, the element does not properly operate.

As described above, the second area 31$b$ is formed by conducting a heat treatment in an oxygen-containing atmosphere or a plasma treatment in an oxygen-containing atmosphere after the resistance-variable element 1 is formed so as to have a predetermined shape. Thus, active oxidation (oxygen diffusion) that is not performed in known semiconductor processes is necessary. However, oxygen in the heat treatment or oxygen in the oxygen plasma does not reach the first contact plug 106 because of the presence of the oxygen diffusion prevention layer 6. As a result, it is possible to prevent the generation of an abnormal contact resistance value which is due to oxidation of the first contact plug 106 and which may cause a defective operation.

In the case where the oxygen diffusion prevention layer 6 is composed of, for example, silicon nitride, oxygen in the heat treatment or oxygen in the oxygen plasma is blocked by the exposed surface of the oxygen diffusion prevention layer 6, thus suppressing entering of oxygen into the oxygen diffusion prevention layer 6. In the case where the oxygen diffusion prevention layer 6 is formed of a silicon-rich oxide film, oxygen is absorbed on the exposed surface of the oxygen diffusion prevention layer 6 or inside the oxygen diffusion prevention layer 6 to prevent the permeation of oxygen. Thus, oxygen diffusion in the other areas is suppressed.

In Reference Example, the oxygen diffusion prevention layer 6 is continuously formed between adjacent first contact plugs 106 connected to each of adjacent resistance-variable elements 1. The oxygen diffusion prevention layer 6 is composed of, for example, an insulating silicon nitride. This structure prevents an electrical short-circuit between adjacent first contact plugs 106.

The upper electrode 4 is formed so as to have a thickness of, for example, about 30 nm. The lower electrode 2 may have a single-layer structure or a laminated structure including multiple layers.

The resistance-variable element 1 has the structure described above.

The third interlayer insulating layer 113 covers the resistance-variable element 1 and a sidewall 5 formed on a sidewall portion of the resistance-variable element 1, and is formed on the oxygen diffusion prevention layer 6.

The third wiring 116 is connected to an upper portion of the resistance-variable element 1, that is, the upper electrode 4 included in the resistance-variable element 1 in a wire trench formed so that the third wiring 116 is embedded in the third interlayer insulating layer 113. The third wiring 116 is formed on a barrier metal layer formed in the wire trench so that the trench is completely filled with, for example, copper or the like. The barrier metal layer is formed by, for example, sequentially depositing a tantalum nitride layer having a thickness of 5 nm or more and 40 nm or less and a tantalum layer having a thickness of 5 nm or more and 40 nm or less.

The fourth wiring 118 and the second contact plug 107 are respectively formed in a wire trench formed for embedding the fourth wiring 118 and in a contact hole formed for embedding the second contact plug 107. The fourth wiring 118 and the second contact plug 107 are formed on a barrier metal layer formed in the wire trench and the contact hole so that the trench and the contact hole are completely filled with, for example, copper or the like. A part of the filled product disposed in the wire trench functions as the fourth wiring 118, and a part of the filled product disposed in the contact hole functions as the second contact plug 107. The barrier metal layer is formed by, for example, sequentially depositing a tantalum nitride layer having a thickness of 5 nm or more and 40 nm or less and a tantalum layer having a thickness of 5 nm or more and 40 nm or less. The second contact plug 107 is formed, for example, so as to have a diameter of 50 nm or more and 200 nm or less.

The nonvolatile memory device 100 has the structure described above.

A nonvolatile memory device usually includes a plurality of resistance-variable elements. However, for the purpose of simplifying the drawing, the drawing mainly shows two resistance-variable elements 1 and components connected to the resistance-variable elements 1. For the sake of ease of understanding, a part of the structure is shown in an enlarged manner.

<Manufacturing Method>

Next, an example of a method for manufacturing the nonvolatile memory device described above will be described.

Figure 8A:
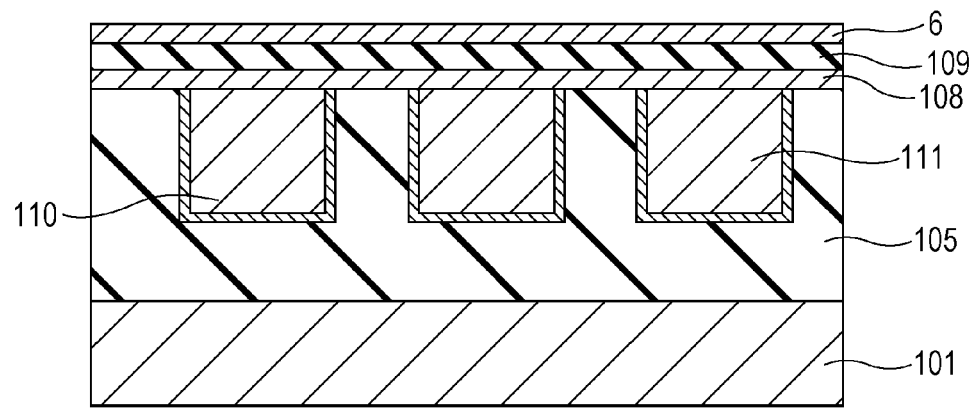
FIGS. 8A to 8J are cross-sectional views each showing a step of an example of a method for manufacturing the nonvolatile memory device according to Reference Example.
Figure 8B:
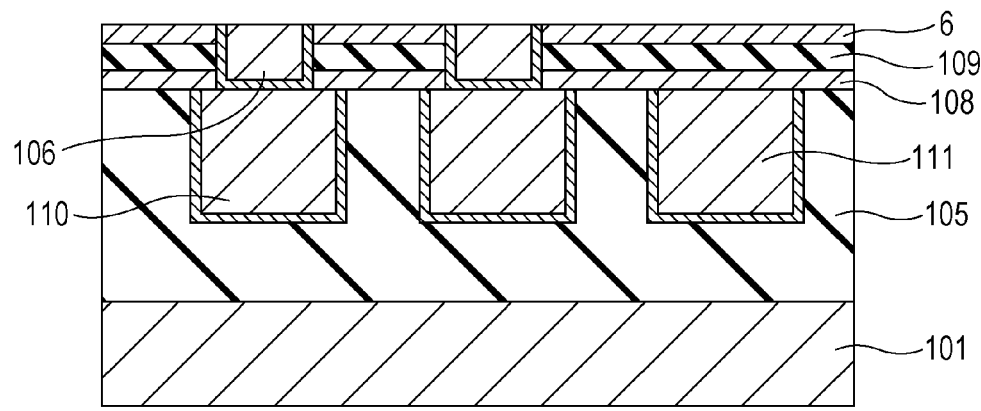
Figure 8C:
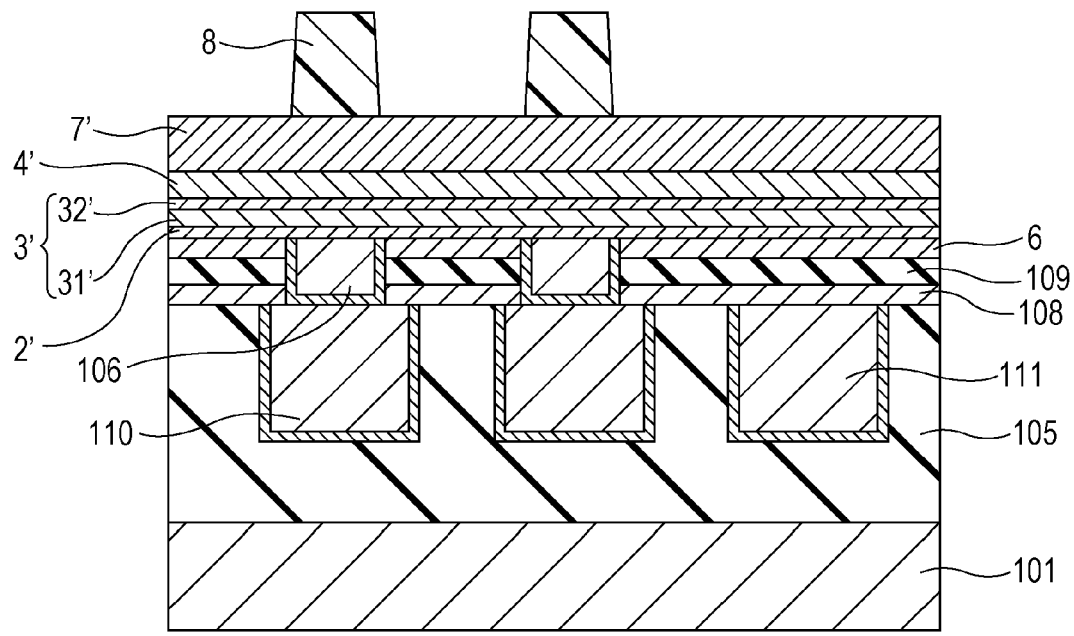
Figure 8D:
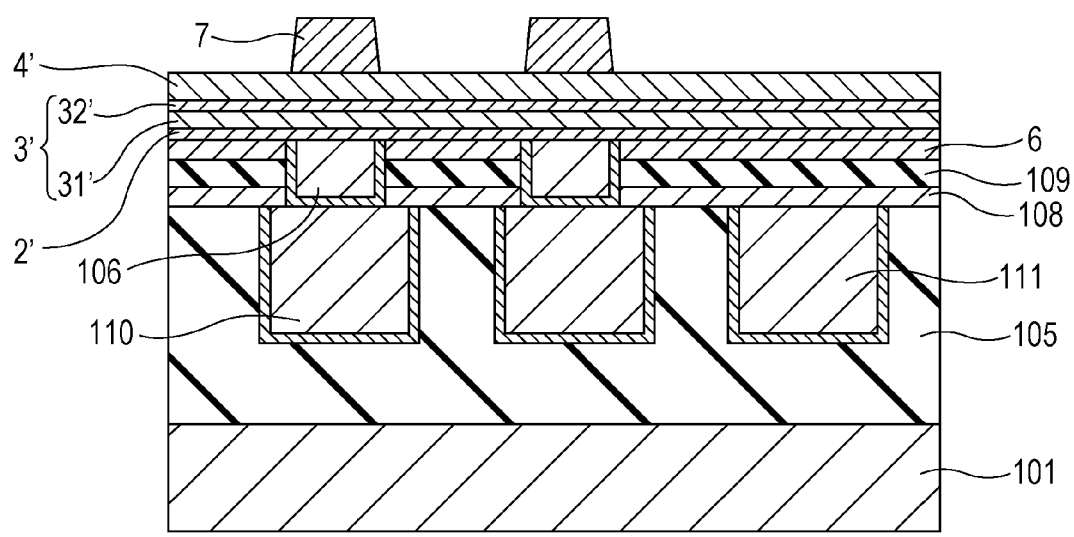
Figure 8E:
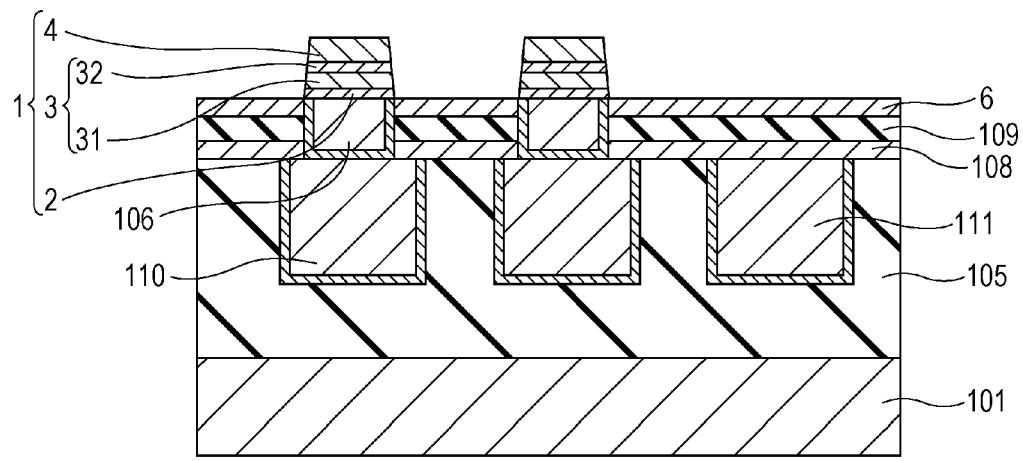
Figure 8F:
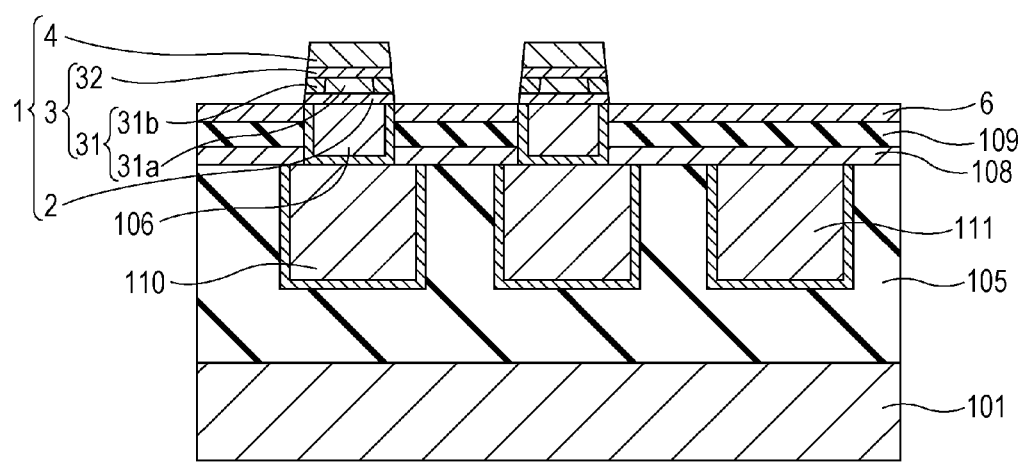
Figure 8G:
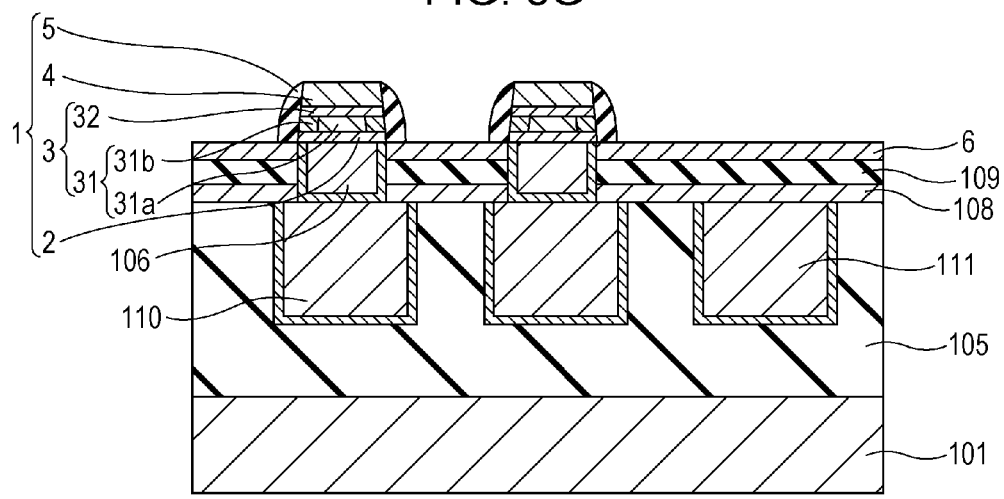
Figure 8H:
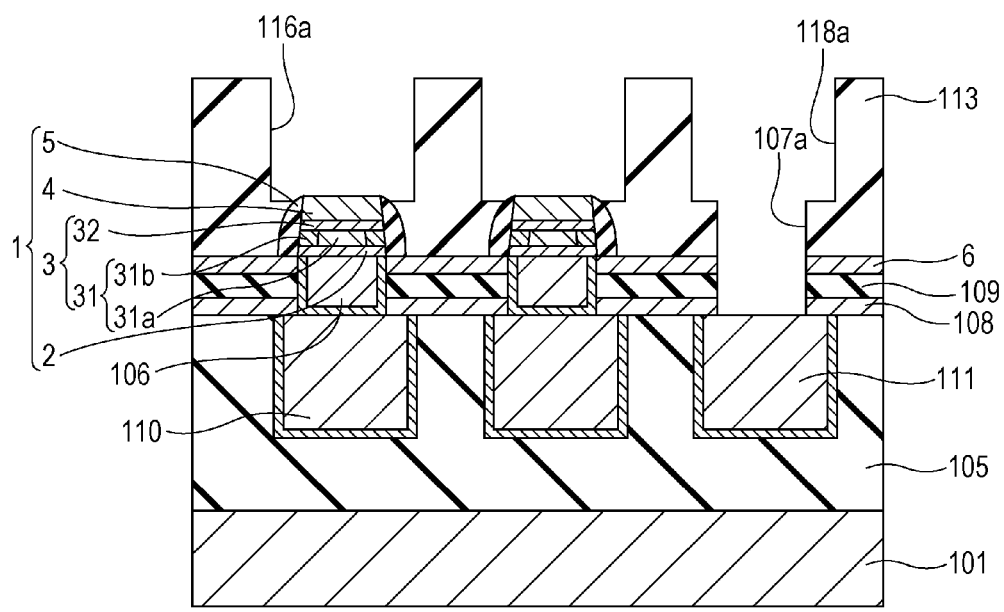
Figure 8I:
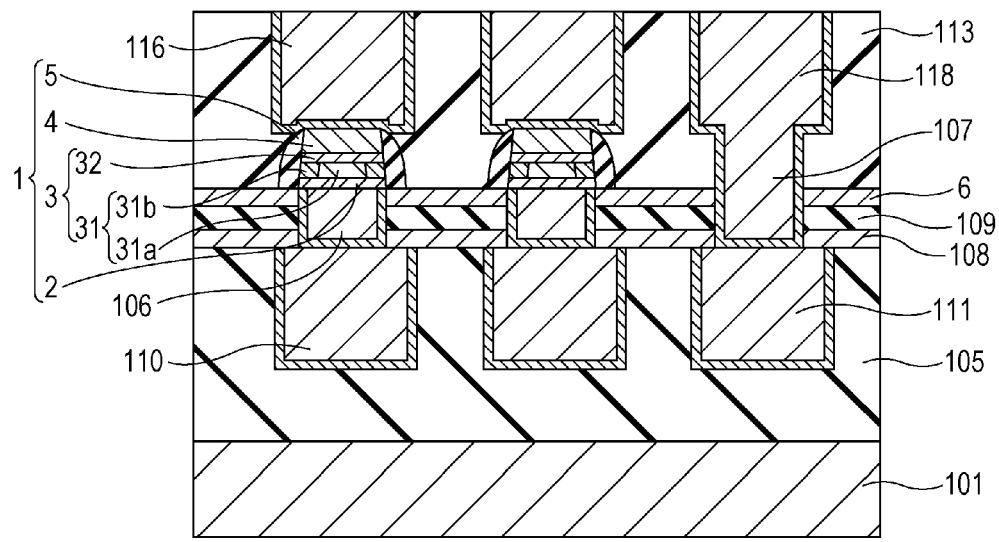
Figure 8J:
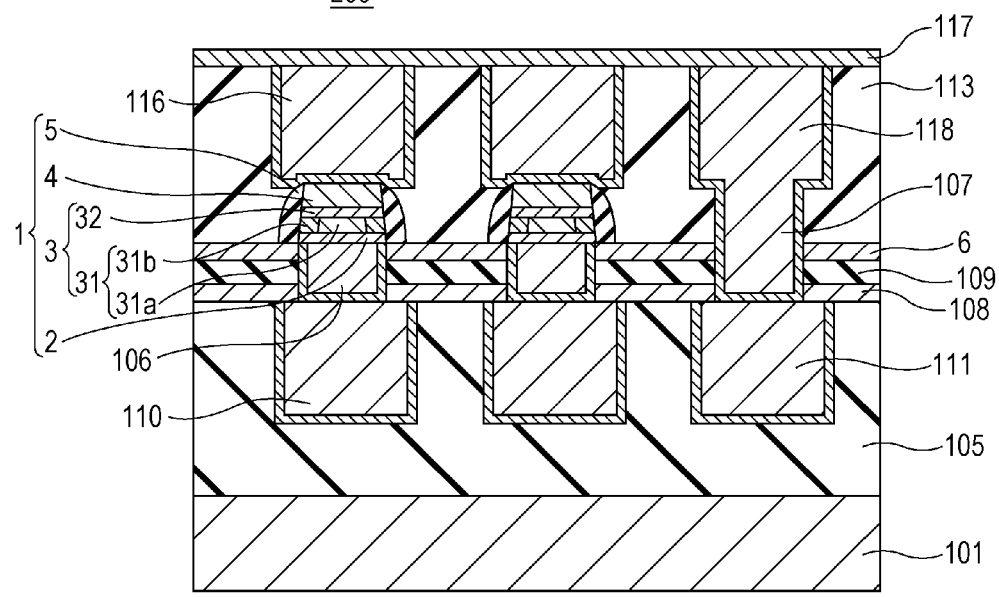

FIGS. 8A to 8J are cross-sectional views each showing a step of an example of the method for manufacturing the nonvolatile memory device 200 according to Reference Example. FIG. 8A is a cross-sectional view showing a step of forming a wiring, an interlayer insulating layer, and an oxygen diffusion prevention layer on a substrate. FIG. 8B is a cross-sectional view showing a step of forming a contact plug. FIG. 8C is a cross-sectional view showing a step of forming a lower electrode material layer, a resistance-variable material layer, an upper electrode material layer, a hardmask layer, and a photoresist. FIG. 8D is a cross-sectional view showing a step of patterning the hardmask layer. FIG. 8E is a cross-sectional view showing a step of forming a resistance-variable element using the hardmask layer. FIG. 8F is a cross-sectional view showing a step of oxidizing a side face of a resistance-variable layer. FIG. 8G is a cross-sectional view showing a step of forming a sidewall protection layer. FIG. 8H is a cross-sectional view showing a step of forming an interlayer insulating layer having a contact hole and a wire trench. FIG. 8I is a cross-sectional view showing a step of forming a contact plug and a wiring. FIG. 8J is a cross-sectional view showing a step of forming a passivation layer.

In usual cases, a large number of resistance-variable elements 1 are formed on a substrate 101. However, for the purpose of simplifying the drawings, FIGS. 8A to 8J show a case where two resistance-variable elements 1 are formed. For the sake of ease of understanding, a part of the structure is shown in an enlarged manner.

First, as shown in FIG. 8A, a wiring, an interlayer insulating layer, and an oxygen diffusion prevention layer are formed on a substrate. Specifically, for example, a first wiring 110 and a second wiring 111 are formed on a substrate 101 composed of a semiconductor in which transistors and the like are formed in advance. Subsequently, a first liner layer 108, a second interlayer insulating layer 109, and an oxygen diffusion prevention layer 6 are sequentially formed on the first wiring 110 and the second wiring 111.

Specifically, a first interlayer insulating layer 105 composed of silicon oxide is formed on the substrate 101 by plasma CVD or the like. Wire trenches for embedding and forming the first wiring 110 and the second wiring 111 therein are then formed in the first interlayer insulating layer 105 by photolithography and dry etching. Subsequently, a barrier metal layer including a tantalum nitride layer (having a thickness of 5 nm or more and 40 nm or less) and a tantalum layer (having a thickness of 5 nm or more and 40 nm or less), and a copper layer (having a thickness of 50 nm or more and 300 nm or less) which is a wire material are deposited in each of the wire trenches by a sputtering method of the like. Furthermore, copper is further deposited by an electrolytic plating method or the like using the copper layer as a seed. Thus, the entire wire trenches are each filled with copper which is a wire material and the barrier metal layer. Subsequently, excessive copper constituting the surface of the deposited copper and an excessive barrier metal layer are removed by CMP, thereby forming the first wiring 110 and the second wiring 111 that have flat surfaces and that are flush with the surface of the first interlayer insulating layer 105.

Subsequently, Silicon nitride is deposited on the first interlayer insulating layer 105, the first wiring 110, and the second wiring 111 by plasma CVD or the like so as to have a thickness of about 30 nm or more and 200 nm or less. Thus, a first liner layer 108 is formed so as to cover the first interlayer insulating layer 105, the first wiring 110, and the second wiring 111. Subsequently, a second interlayer insulating layer 109 is further deposited on the first liner layer 108. If necessary, the difference in the level of the surface is then reduced by CMP. Subsequently, for example, silicon nitride having a thickness of 30 nm or more and 200 nm or less is deposited on the second interlayer insulating layer 109 to form an oxygen diffusion prevention layer 6.

Next, as shown in FIG. 8B, a contact plug is formed. Specifically, for example, a first contact plug 106 connected to the first wiring 110 is formed on the first wiring 110.

Specifically, a contact hole is formed at a predetermined position on the first wiring 110 by photolithography and dry etching so as to expose the first wiring 110. A barrier metal layer including a tantalum nitride layer (having a thickness of 5 nm or more and 40 nm or less) and a tantalum layer (having a thickness of 5 nm or more and 40 nm or less), and a copper layer (having a thickness of 50 nm or more and 300 nm or less) which is a contact material are then deposited on the oxygen diffusion prevention layer 6 having the contact holes by a sputtering method or the like. Furthermore, copper is further deposited by an electrolytic plating method or the like using the copper layer as a seed. Thus, the entire contact hole is filled with the barrier metal layer and copper. Subsequently, excessive copper and an excessive barrier metal layer on the surface are removed by CMP, thereby forming the first contact plug 106 that has a flat surface and that is flush with the surface of the oxygen diffusion prevention layer 6.

During this polishing by CMP, the oxygen diffusion prevention layer can be used as a polishing stopper film. Thus, erosion caused during the polishing by CMP is suppressed.

Next, as shown in FIG. 8C, a lower electrode layer 2', a resistance-variable material layer 3', an upper electrode layer 4', a hardmask layer 7', and a photoresist are formed. Specifically, for example, on a top surface (exposed surface) of the first contact plug 106 and the oxygen diffusion prevention layer 6, a lower electrode layer 2' composed of tantalum nitride (having a thickness of 20 nm), a first resistance-variable material layer 31', a second resistance-variable material layer 32', and an upper electrode layer 4' composed of iridium (having a thickness of 30 nm) are sequentially deposited by a sputtering method or the like. Subsequently, as a hardmask in dry etching, a hardmask layer 7' which is a conductive layer and composed of any of titanium nitride and titanium aluminum nitride (for example, titanium aluminum nitride) (having a thickness of 50 nm) is deposited by a sputtering method or the like. Subsequently, a resist mask 8 for forming a resistance-variable element 1 is formed on the hardmask layer 7' by photolithography.

The first resistance-variable material layer 31' is deposited by a reactive sputtering method in which sputtering is performed in an argon atmosphere containing oxygen using a metal tantalum target. The top surface of the first resistance-variable material layer 31' is then subjected to a plasma oxidation processing in an oxygen atmosphere to form the second resistance-variable material layer 32' on the first resistance-variable material layer 31'.

More specifically, $TaO_x$ is deposited as the first resistance-variable material layer 31' so as to have a thickness of 20 nm, and the top surface of the $TaO_x$ is then oxidized by plasma oxidation in an oxygen atmosphere. Thus, the second resistance-variable material layer 32' composed of $TaO_y$ is formed on the first resistance-variable material layer 31' composed of $TaO_x$ so as to have a thickness of 5 nm.

The method of oxidation is not limited to plasma oxidation. Alternatively, another processing having an effect of oxidizing a surface, for example, a heat treatment in an oxygen atmosphere may be performed.

Alternatively, instead of the oxidization, after $TaO_x$ is deposited so as to have a thickness of 15 nm, $TaO_y$ may be deposited as the second resistance-variable material layer 32' by reactive sputtering so as to have a thickness of 5 nm. In reaction sputtering, the content of oxygen contained in the film can be adjusted by changing the oxygen concentration in the sputtering atmosphere or using a transition metal oxide target as a target. A metal tantalum target or a tantalum oxide target (for example, $Ta_2O_5$) may be used as the target for forming $TaO_y$.

Next, as shown in FIG. 8D, the hardmask layer 7' is patterned. Specifically, for example, the hardmask layer 7' is patterned by using the resist mask 8 so as to have a desired shape. Thus, a hardmask 7 is formed. The resist mask 8 is then removed by asking.

Next, as shown in FIG. 8E, a resistance-variable element is formed by using the hardmask. Specifically, for example, the upper electrode layer 4', the second resistance-variable material layer 32', the first resistance-variable material layer 31', and the lower electrode layer 2' are patterned by using the hardmask 7 to form a resistance-variable element 1. The hardmask 7 is then removed by, for example, etching. The hardmask 7 may not be removed and may be left as required.

Next, as shown in FIG. 8F, the side face of the resistance-variable layer is oxidized (subjected to sidewall oxidation). Specifically, for example, the resistance-variable element 1 formed by patterning is subjected to a heat treatment in an oxygen-containing atmosphere or a plasma treatment in an oxygen-containing atmosphere, thereby increasing the oxygen content of the side face of the first resistance-variable layer 31. Thus, a first area 31a and a second area 31b whose oxygen content becomes higher than that of the first area 31a are formed. In the case where the second resistance-variable layer 32 originally has an oxygen content close to that of an insulator (for example, $Ta_2O_5$), the exposed side face of the second resistance-variable layer 32 is not oxidized. Specifically, the temperature of the heat treatment in an oxygen-containing atmosphere or the plasma treatment in an oxygen-containing atmosphere may be, for example, in the range of 350° C. to 500° C.

In the step of the oxygen plasma treatment, the oxygen diffusion prevention layer 6 is provided on the second interlayer insulating layer 109 in which the first contact plug 106 connected to the resistance-variable element 1 is embedded. That is, at the time when the resistance-variable element 1 is formed by patterning in the step shown in FIG. 8E, a region other than a region where the resistance-variable element 1 is formed, is covered with the oxygen diffusion prevention layer 6, viewed from the top surface of the substrate. Accordingly, in the step of actively oxidizing the sidewall of the resistance-variable layer, the step being not included in known semiconductor processes and being specific to a process for manufacturing a resistance-variable element, oxygen in the heat treatment or oxygen in the oxygen plasma does not easily reach the first contact plugs 106 because of the presence of the oxygen diffusion prevention layer 6. Thus, the first contact plug 106 is not easily oxidized, and it is possible to prevent the first contact plug 106 from showing an abnormal contact resistance value which may cause a defective operation.

In the case where the oxygen diffusion prevention layer 6 is composed of, for example, silicon nitride, oxygen in the heat treatment or oxygen in the oxygen plasma is blocked by the exposed surface of the oxygen diffusion prevention layer 6, thus suppressing entering of oxygen into the oxygen diffusion prevention layer 6.

In the case where the oxygen diffusion prevention layer 6 is formed of a silicon-rich oxide film (oxygen-deficient silicon oxide), oxygen is absorbed on the exposed surface of the oxygen diffusion prevention layer 6 or inside the oxygen diffusion prevention layer 6 to prevent the permeation of oxygen. Thus, oxygen diffusion in the first contact plugs 106 is suppressed.

Next, as shown in FIG. 8G, a sidewall protection layer is formed. Specifically, for example, an insulating layer composed of silicon nitride (having a thickness of 170 nm) is deposited by plasma CVD so as to cover the resistance-variable element 1 and the exposed oxygen diffusion prevention layer 6. Subsequently, etching back (anisotropic etching) is performed to remove only the insulating layer on the top surface of the upper electrode 4 of the resistance-variable element 1 and on the top surface of the oxygen diffusion prevention layer 6. By performing etching back in this manner, a sidewall (sidewall protection layer) 5 can be formed on the sidewall of the resistance-variable element 1.

An example of the method for etching back the insulating layer composed of silicon nitride is a method using reactive ion etching (RIE). In the case where reactive ion etching is employed, in general, an etching speed in an ion-incident direction (vertical direction) is significantly higher than an etching speed in another direction (horizontal direction). Therefore, by performing etching back using reactive ion etching, the insulating layer can be left only on sidewall portion of the resistance-variable element 1, and the sidewall 5 (having a maximum thickness of 150 nm in a lower portion) can be formed. Herein, the term "thickness of a sidewall" refers to a thickness of an insulating layer deposited in a direction perpendicular to a thickness direction of the substrate 101.

Next, as shown in FIG. 8H, an interlayer insulating layer having a contact hole and wire trenches is formed. Specifically, for example, a third interlayer insulating layer 113 is formed so as to cover the resistance-variable element 1, the sidewall 5, and the oxygen diffusion prevention layer 6. Subsequently, a third wire trench 116a for embedding and forming a third wiring 116 therein is formed in the third interlayer insulating layer 113 so as to expose the upper electrode 4. A second contact hole 107a for embedding and forming a second contact plug 107 therein is formed so as to penetrate through the third interlayer insulating layer 113, the oxygen diffusion prevention layer 6, the second interlayer insulating layer 109, and the first liner layer 108 and to expose the second wiring 111. A fourth wire trench 118a for embedding and forming a fourth wiring 118 is formed in the third interlayer insulating layer 113 so as to be connected to the second contact hole 107a.

More specifically, for example, after a third interlayer insulating layer 113 is deposited, a third wire trench 116a and a fourth wire trench 118a are formed in the third interlayer insulating layer 113 by photolithography and dry etching. In the step of dry etching for forming the third wire trench 116a, the top surface of the upper electrode 4 of the resistance-variable element 1 is exposed. In addition, a second contact hole 107a is formed so as to expose the second wiring 111.

In general, the second contact hole 107a is formed in advance by photolithography and dry etching at a first time, and the third wire trench 116a and the fourth wire trench 118a are then formed by photolithography and dry etching at a second time. Alternatively, the third wire trench 116a and the fourth wire trench 118a may be formed in advance.

Next, as shown in FIG. 8I, a contact plug and wirings are formed. Specifically, for example, a barrier metal layer having a laminated structure including a tantalum nitride layer (having a thickness of 5 nm or more and 40 nm or less) and a tantalum layer (having a thickness of 5 nm or more and 40 nm or less), and a copper layer (having a thickness of 50 nm or more and 300 nm or less) are deposited in the second contact hole 107a, the third wire trench 116a, and the fourth wire trench 118a by a sputtering method or the like. Copper is then further deposited by an electrolytic plating method or the like using the copper layer as a seed. Thus, all the second contact hole 107a, the third wire trench 116a, and the fourth wire trench 118a are filled with copper and the barrier metal layer. Subsequently, excessive copper constituting the surface of the deposited copper and an excessive barrier metal layer are removed by CMP, thereby forming a third wiring 116 and a fourth wiring 118 that have flat surfaces and that are flush with the surface of the third interlayer insulating layer 113, and a second contact plug 107 that connects an lower end of the fourth wiring 118 to the second wiring 111. The second contact plug 107 functions as a lead contact.

Next, as shown in FIG. 8J, a passivation layer is formed. Specifically, for example, a silicon nitride layer having a thickness of 30 nm or more and 200 nm or less, for example, about 50 nm is deposited on the third wiring 116, the fourth wiring 118, and the third interlayer insulating layer 113 by plasma CVD or the like so as to cover the third wiring 116 and the fourth wiring 118. Thus, a passivation film 117 is formed.

As described above, according to the method for manufacturing a nonvolatile memory device of Reference Example, even when an active oxidation process that is not performed in known semiconductor processes is performed, contact plugs connected to resistance-variable elements are not oxidized, and a stable nonvolatile memory device can be produced.

According to the method for manufacturing a nonvolatile memory device of Reference Example, the oxidation process is performed after the resistance-variable elements are formed by patterning. Therefore, it is possible to prevent the formation of a lower electrode having a tapered shape, which is caused by a difficulty in etching of the lower electrode due to patterning of the lower electrode. Consequently, even when the gap between the resistance-variable elements is reduced, the resistance-variable elements can be reliably separated from each other, and the resistance-variable elements can be arranged at a high density. Thus, a nonvolatile memory device having a large storage capacity can be produced.

According to the method for manufacturing a nonvolatile memory device of Reference Example, during the polishing by CMP used in the step of forming the contact plugs, the oxygen diffusion prevention layer can be used as a polishing stopper film. Thus, erosion caused during the polishing by CMP can be suppressed, and resistance-variable elements having stable shapes can be realized. Accordingly, it is possible to produce a nonvolatile memory device in which variations in the operation are suppressed.

Reference Example can also be modified. For example, in Reference Example, the sidewall 5 may be omitted. The side face of the resistance-variable layer 3 may not be oxidized. The resistance-variable layer 3 may have a single-layer structure composed of a material having a single composition.

EXAMPLE

<Device Structure>

Figure 9:
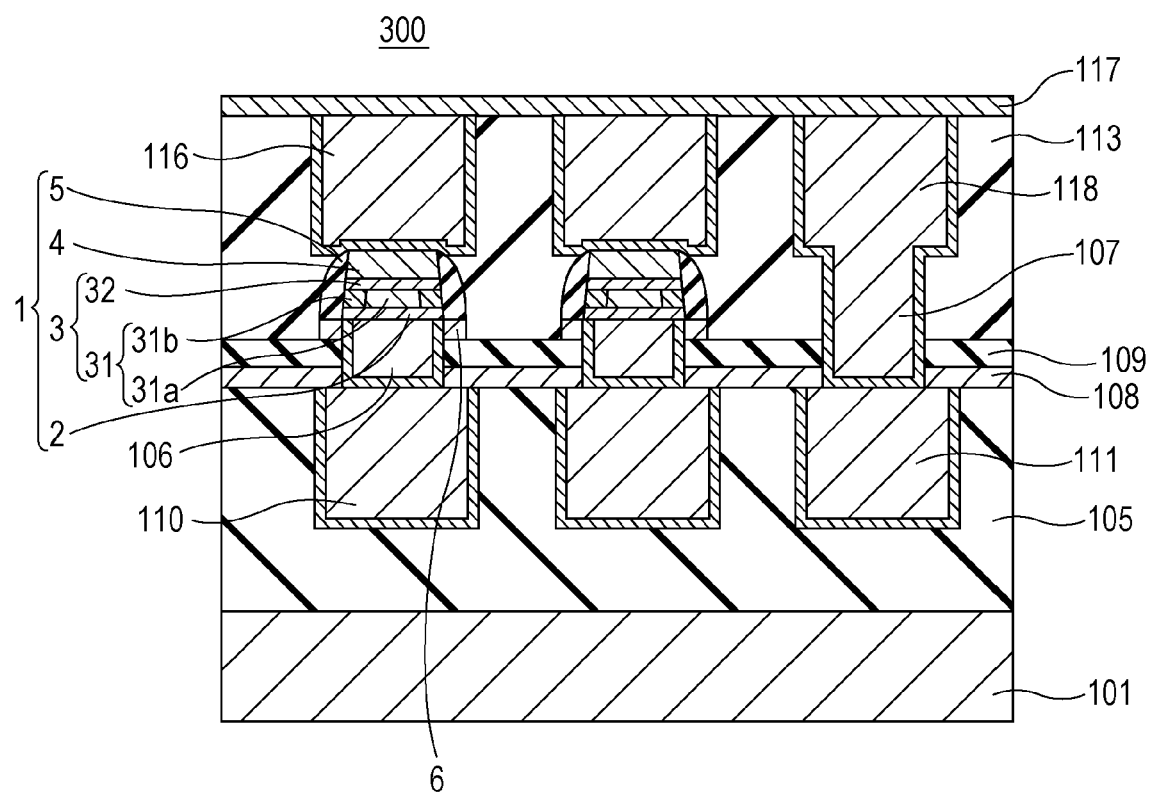
FIG. 9 is a cross-sectional view showing a schematic structure of a nonvolatile memory device according to Example.

FIG. 9 is a cross-sectional view showing a schematic structure of a nonvolatile memory device according to Example. A nonvolatile memory device 300 of Example will now be described with reference to FIG. 9.

As shown in FIG. 9, in the nonvolatile memory device 300, an oxygen diffusion prevention layer 6 is provided only in the peripheries of first contact plugs 106, and the oxygen diffusion prevention layer 6 is divided into portions between one first contact plug 106 and another first contact plug 106 that is connected to an adjacent resistance-variable element 1.

Specifically, the oxygen diffusion prevention layer 6 contacts a side face of a first contact plug 106, a bottom portion of a lower electrode 2, and a bottom portion of a sidewall 5 of a resistance-variable element 1. A side end face of the oxygen diffusion prevention layer 6 is flush with a bottom side face of the sidewall 5. A third interlayer insulating layer 113 is formed between divided portions of the oxygen diffusion prevention layer 6. A second contact plug 107 penetrates through the third interlayer insulating layer 113, a second interlayer insulating layer 109, and a first liner layer 108 without penetrating through the oxygen diffusion prevention layer 6, and is connected to a second wiring 111.

In Example, for example, even when a conductive material is used for the oxygen diffusion prevention layer 6, the possibility of an electrical short-circuit between adjacent resistance-variable elements 1 can be reduced by dividing the oxygen diffusion prevention layer 6 so as to correspond to the respective resistance-variable elements 1. Thus, the range of selectivity for the material of the oxygen diffusion prevention layer 6 can be expanded. For example, a silicon-rich oxide, aluminum oxide, or titanium oxide can be used as the material of the oxygen diffusion prevention layer 6.

Since the oxygen diffusion prevention layer 6 is divided so as to correspond to adjacent resistance-variable elements 1, the oxygen diffusion prevention layer 6 is not continuously present between the adjacent resistance-variable elements 1. In the case where the oxygen diffusion prevention layer 6 is continuously formed between adjacent resistance-variable elements 1 by using a so-called Hi-k material (such as silicon nitride) having a high dielectric constant, a parasitic capacitance between a first wiring 110 and a third wiring 116 formed above of a resistance-variable element 1 becomes large. However, with this structure of Example, the parasitic capacitance can be decreased. As a result, reliability and a high-speed performance of the nonvolatile memory device can be enhanced.

<Manufacturing Method>

A method for manufacturing the nonvolatile memory device of Example will be described below.

The method for manufacturing the nonvolatile memory device of Example and the above-described method for manufacturing the nonvolatile memory device shown in FIGS. 8A to 8J differ in the steps shown in FIGS. 8G and 8H.

Figure 10A:
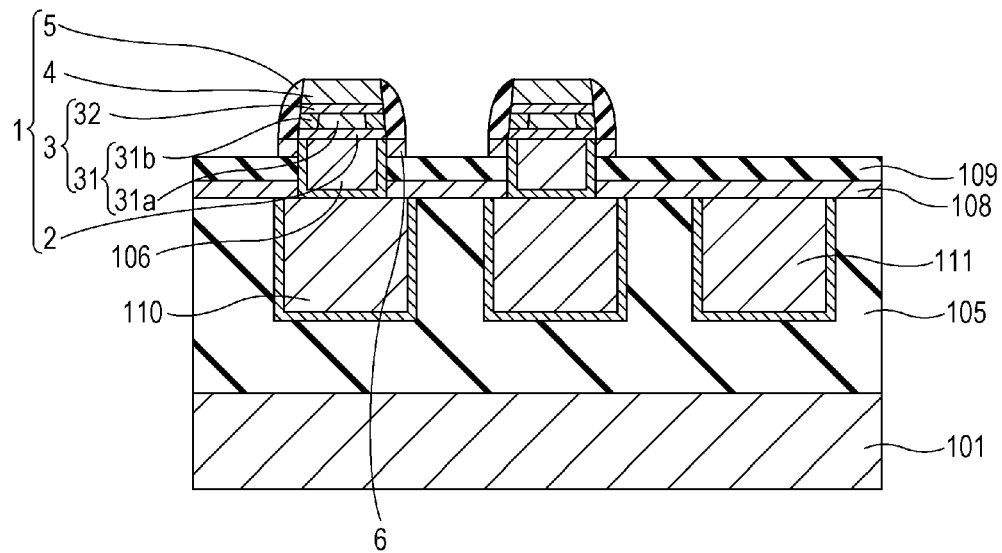
FIGS. 10A to 10D are cross-sectional views each showing a step of an example of a method for manufacturing the nonvolatile memory device according to Example.
Figure 10B:
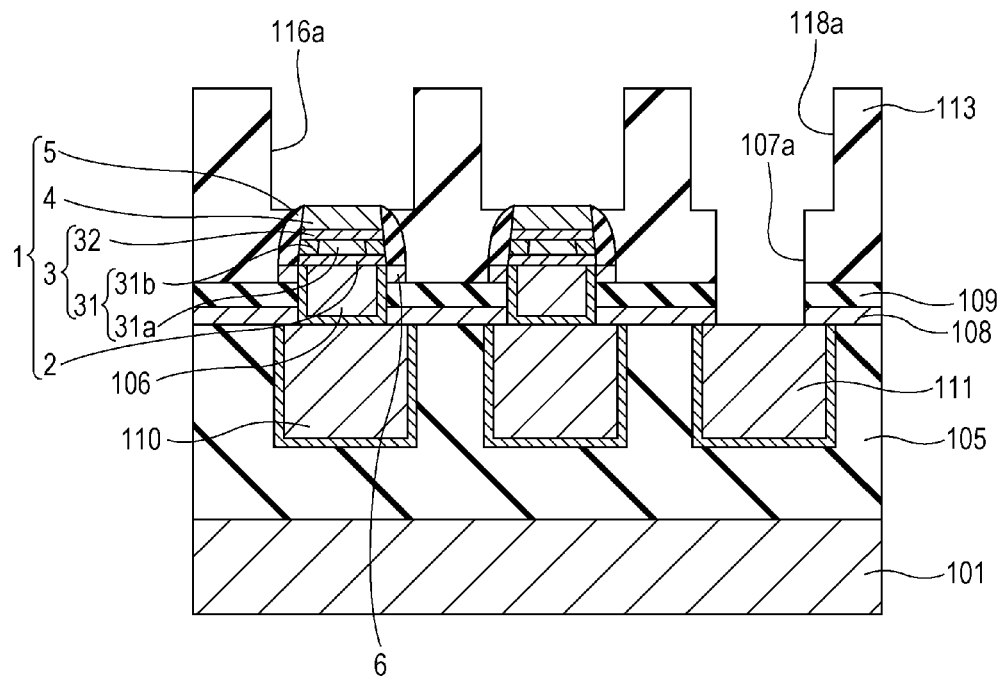
Figure 10C:
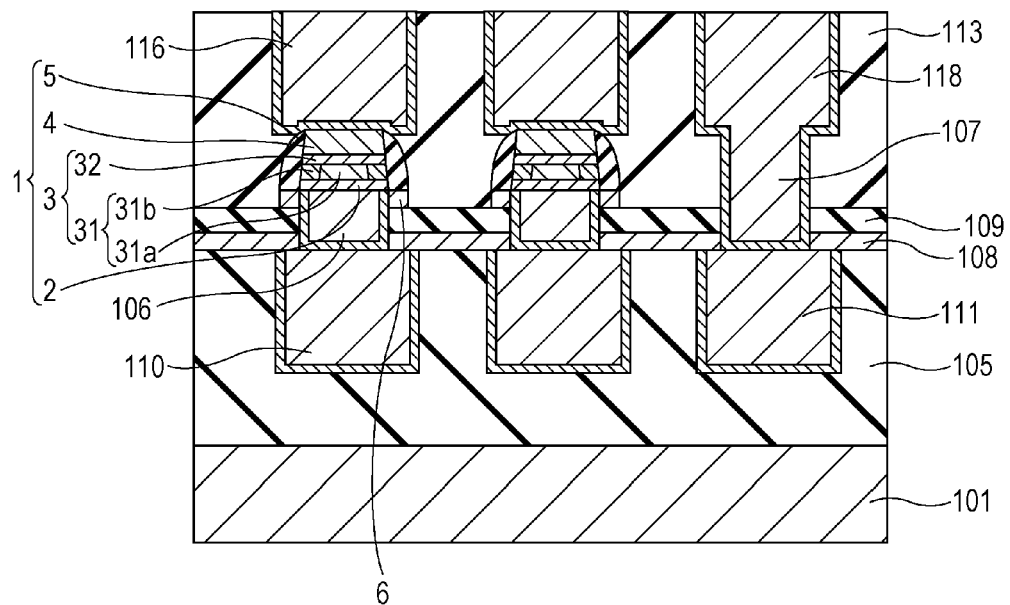
Figure 10D:
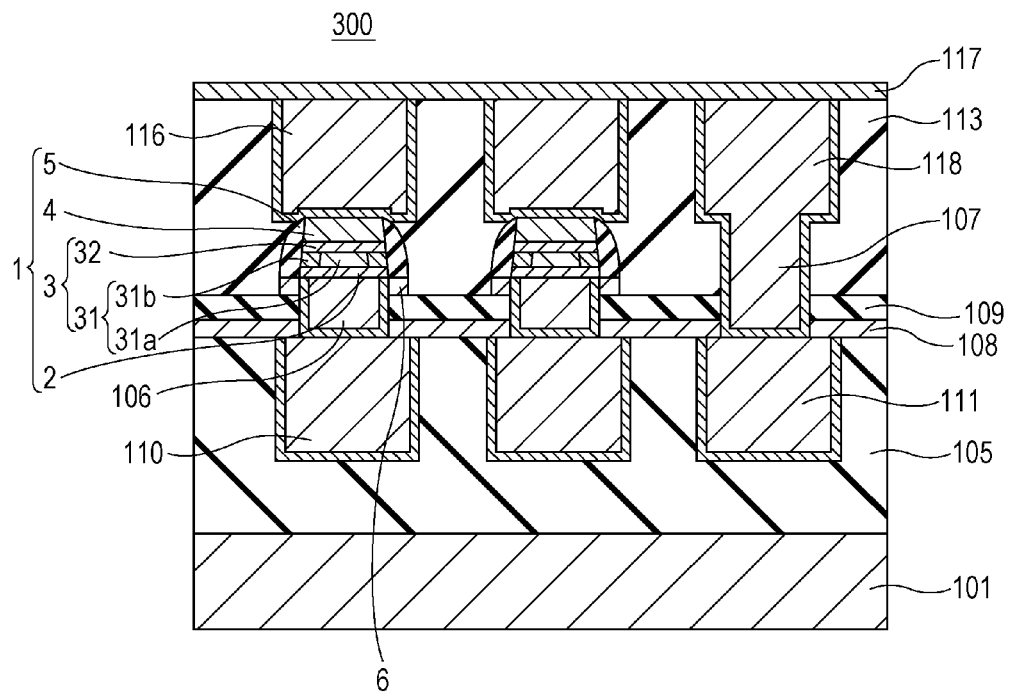

FIGS. 10A to 10D are cross-sectional views each showing a step of an example of the method for manufacturing the nonvolatile memory device according to Example. FIG. 10A is a cross-sectional view showing a step of forming a sidewall protection layer and patterning an oxygen diffusion prevention layer. FIG. 10B is a cross-sectional view showing a step of forming an interlayer insulating layer having a contact hole and wire trenches. FIG. 10C is a cross-sectional view showing a step of forming a contact plug and wirings. FIG. 10D is a cross-sectional view showing a step of forming a passivation layer.

In the method for manufacturing the nonvolatile memory device of Example, after the step of oxidizing a sidewall described with reference to FIG. 8F, when an insulating sidewall 5 is formed on side faces of an upper electrode 4, a resistance-variable layer 3, and a lower electrode 2, an oxygen diffusion prevention layer 6 is patterned at the same time so as to have a predetermined shape. Thus, the oxygen diffusion prevention layer 6 is divided into portions so as to correspond to respective first contact plugs 106. When viewed from a top surface of a substrate, the oxygen diffusion prevention layer 6 is removed above a second wiring 111. A second contact hole 107a is formed so as to penetrate through a third interlayer insulating layer 113, a second interlayer insulating layer 109, and a first liner layer 108 and to expose the second wiring 111.

Specifically, in the method for manufacturing the nonvolatile memory device of Example, in the step shown in FIG. 10A, a sidewall (sidewall protection layer) 5 is formed, and an oxygen diffusion prevention layer 6 is pattered by using this sidewall 5 as a mask. The method will be described in detail below.

First, an insulating layer composed of silicon nitride (having a thickness of 170 nm) is deposited by plasma CVD so as to cover resistance-variable elements 1 and an oxygen diffusion prevention layer 6. Subsequently, etching back (anisotropic etching) is performed to remove the insulating layer formed on the top surface of the upper electrode 4 of each of the resistance-variable elements 1 and on the top surface of the oxygen diffusion prevention layer 6, and is performed to remove the oxygen diffusion prevention layer 6 exposed between adjacent sidewalls 5. By performing etching back in this manner, sidewalls 5 are formed on sidewalls of the resistance-variable elements 1, and the oxygen diffusion prevention layer 6 can be divided into portions so as to correspond to respective first contact plugs 106.

In this step, an example of the method for etching back the insulating layer composed of silicon nitride is a method using reactive ion etching (RIE). In the case where reactive ion etching is employed, in general, an etching speed in an ion-incident direction (vertical direction) is significantly higher than an etching speed in another direction (horizontal direction). Therefore, by performing etching back using reactive ion etching, the insulating layer can be left only on sidewall portions of the resistance-variable elements 1, and the sidewalls 5 (having a thickness of 150 nm) can be formed. Furthermore, by continuously etching the oxygen diffusion prevention layer 6 by the same method, the oxygen diffusion prevention layer 6 can be divided into portions each having an end surface that is substantially the same as that of the sidewall 5.

Next, as shown in FIG. 10B, an interlayer insulating layer having a contact hole and wire trenches is formed. Specifically, for example, a third interlayer insulating layer 113 is formed so as to cover the resistance-variable elements 1, the sidewalls 5, and the oxygen diffusion prevention layer 6. Subsequently, third wire trenches 116a for embedding and forming third wirings 116 therein are formed in the third interlayer insulating layer 113 so as to expose the upper electrodes 4. A second contact hole 107a for embedding and forming a second contact plug 107 therein is formed so as to penetrate through the third interlayer insulating layer 113, a second interlayer insulating layer 109, and a first liner layer 108 and to expose a second wiring 111. A fourth wire trench 118a for embedding and forming a fourth wiring 118 is formed in the third interlayer insulating layer 113 so as to be connected to the second contact hole 107a. A specific method in the step shown in FIG. 10B can be similarly realized as in the method of Reference Example described with reference to FIG. 8H. Therefore, a description of the method is omitted.

Next, as shown in FIG. 10C, a contact plug and wirings are formed. A specific method in the step shown in FIG. 10C can be similarly realized as in the method of Reference Example described with reference to FIG. 8I. Therefore, a description of the method is omitted.

Next, as shown in FIG. 10D, a passivation layer is formed. A specific method in the step shown in FIG. 10D can be similarly realized as in the method of Reference Example described with reference to FIG. 8J. Therefore, a description of the method is omitted.

As described above, according to the method for manufacturing a nonvolatile memory device of Example, in addition to the advantages of the method for manufacturing a nonvolatile memory device of Reference Example described above, for example, an electrical short-circuit between adjacent resistance-variable elements 1 can be prevented, even when a conductive material is used as the oxygen diffusion prevention layer 6. Thus, a material can be freely selected as the oxygen diffusion prevention layer 6.

Since the oxygen diffusion prevention layer 6 is divided into portions between adjacent resistance-variable elements 1, the oxygen diffusion prevention layer 6 is not continuously present between the adjacent resistance-variable elements 1. In the case where the oxygen diffusion prevention layer 6 is continuously formed between adjacent resistance-variable elements 1 by using a so-called Hi-k material (such as silicon nitride) having a high dielectric constant, a parasitic capacitance between the first wiring 110 and the third wiring 116 formed on the upper side of a resistance-variable element 1 becomes large. However, with this structure of this Example, the parasitic capacitance is decreased. As a result, reliability and a high-speed performance of the nonvolatile memory device is enhanced.

Furthermore, in the step of forming the second contact hole 107a, even when the etching rate of the third interlayer insulating layer 113 or the second interlayer insulating layer 109 is different from the etching rate of the oxygen diffusion prevention layer 6, the oxygen diffusion prevention layer 6 is not provided in a portion where the second contact hole 107a is to be formed. Accordingly, etching is not stopped on the oxygen diffusion prevention layer 6, and thus the second contact hole 107a can be formed so as to reliably expose the second wiring 111. Consequently, the second contact plug 107 can be formed so as to be reliably connected to the second wiring 111.

Example described above can also be modified. For example, in Example, the sidewall 5 may be omitted. The side face of the resistance-variable layer 3 may not be oxidized. The resistance-variable layer 3 may have a single-layer structure composed of a material having a single composition.

On the basis of the above description, various modifications and other embodiments of the present disclosure will become apparent to those skilled in the art. Accordingly, it is to be understood that the above description is only illustrative. The details of the structures and/or the functions in the present disclosure may be substantially changed without departing from the spirit of the present disclosure.

An embodiment of the present disclosure is useful as a nonvolatile memory device that can realize further miniaturization of a nonvolatile memory element while suppressing oxidation of a contact plug.

What is claimed is:

1. A nonvolatile memory device comprising:
   an insulating layer;
   a plurality of oxygen diffusion prevention layers disposed on the insulating layer;
   a plurality of contact plugs, each of the plurality of the contact plugs penetrating through each of the plurality of the oxygen diffusion prevention layers and at least a part of the insulating layer; and
   a plurality of resistance-variable elements, each of the plurality of the resistance-variable elements covering each of the plurality of the contact plugs exposed on surfaces of the oxygen diffusion prevention layers and being electrically connected to each of the plurality of the contact plugs,
   wherein each of the oxygen diffusion prevention layers is provided only between the insulating layer and each of the plurality of the resistance-variable elements to correspond to each of the plurality of the contact plugs arranged for each of the plurality of the resistance-variable elements, and
   wherein each of the plurality of the resistance-variable elements includes:
   a first electrode;
   a second electrode disposed above the first electrode; and
   a resistance-variable layer which is disposed between the first electrode and the second electrode, and resistance value of the resistance-variable layer changing reversibly on the basis of an electrical signal provided between the first electrode and the second electrode.

2. The nonvolatile memory device according to claim 1, wherein each of the plurality of the resistance-variable elements further includes a sidewall protection layer that covers a sidewall of each of the plurality of the resistance-variable elements and that is composed of an insulating material.

3. The nonvolatile memory device according to claim 1, wherein each of the plurality of the resistance-variable elements further includes a sidewall protection layer that covers a sidewall of each of the plurality of the resistance-variable elements and that is composed of an insulating material, and
in a thickness direction of the insulating layer, an outer periphery of the sidewall protection layer is flush with an outer periphery of the corresponding oxygen diffusion prevention layer.

4. The nonvolatile memory device according to claim 1, wherein each of the plurality of the oxygen diffusion prevention layers is composed of at least one selected from the group consisting of nitrides, oxygen-deficient silicon oxides, oxygen-deficient aluminum oxides, and oxygen-deficient titanium oxides.

5. The nonvolatile memory device according to claim 1, wherein a peripheral edge of each of the resistance-variable layers is oxidized.

6. The nonvolatile memory device according to claim 2, wherein the sidewall protection layer and the oxygen diffusion prevention layers are composed of the same material.

7. The nonvolatile memory device according to claim 3, wherein the sidewall protection layer and the oxygen diffusion prevention layers are composed of the same material.

* * * * *